(12) United States Patent
Holder et al.

(10) Patent No.: US 9,136,673 B2
(45) Date of Patent: Sep. 15, 2015

(54) STRUCTURE AND METHOD FOR THE FABRICATION OF A GALLIUM NITRIDE VERTICAL CAVITY SURFACE EMITTING LASER

(71) Applicant: The Regents of the University of California, Oakland, CA (US)

(72) Inventors: Casey O. Holder, Goleta, CA (US); Daniel F. Feezell, Albuquerque, NM (US); Steven P. DenBaars, Goleta, CA (US); James S. Speck, Goleta, CA (US); Shuji Nakamura, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 13/947,755

(22) Filed: Jul. 22, 2013

(65) Prior Publication Data

US 2014/0023102 A1    Jan. 23, 2014

Related U.S. Application Data

(60) Provisional application No. 61/673,966, filed on Jul. 20, 2012, provisional application No. 61/673,985, filed on Jul. 20, 2012, provisional application No. 61/673,994, filed on Jul. 20, 2012, provisional application No. 61/674,035, filed on Jul. 20, 2012, provisional application No. 61/674,003, filed on Jul. 20, 2012, provisional application No. 61/674,012, filed on Jul. 20, 2012, provisional application No. 61/707,118, filed on Sep. 28, 2012, provisional application No. 61/679,553, filed on Aug. 3, 2012.

(51) Int. Cl.
*H01S 5/00* (2006.01)
*H01S 5/10* (2006.01)
*H01S 5/183* (2006.01)
*H01S 5/343* (2006.01)
*B82Y 20/00* (2011.01)
*H01S 5/02* (2006.01)
(Continued)

(52) U.S. Cl.
CPC .............. *H01S 5/1039* (2013.01); *B82Y 20/00* (2013.01); *H01S 5/0217* (2013.01); *H01S 5/183* (2013.01); *H01S 5/18355* (2013.01); *H01S 5/18358* (2013.01); *H01S 5/34333* (2013.01); *H01S 5/005* (2013.01); *H01S 5/0215* (2013.01); *H01S 5/0425* (2013.01); *H01S 5/18341* (2013.01); *H01S 5/18369* (2013.01); *H01S 5/2009* (2013.01); *H01S 5/209* (2013.01); *H01S 5/3202* (2013.01); *H01S 5/423* (2013.01); *H01S 2301/176* (2013.01)

(58) Field of Classification Search
USPC ................... 372/43.01, 46.01, 46.012, 50.11
See application file for complete search history.

(56) References Cited

U.S. PATENT DOCUMENTS 6,093,952 A    7/2000   Bandic et al.
6,735,234 B1   5/2004   Paschotta et al.
(Continued)

FOREIGN PATENT DOCUMENTS

WO    2005/112123    11/2005
WO    2013/123241    8/2013

OTHER PUBLICATIONS

PCT International Search Report and Written Opinion dated Apr. 19, 2013 for PCT App. No. PCT/US2013/026205.
(Continued)

*Primary Examiner* — Dung Nguyen
(74) *Attorney, Agent, or Firm* — Gates & Cooper LLP

(57) ABSTRACT

A III-Nitride based Vertical Cavity Surface Emitting Laser (VCSEL), wherein a cavity length of the VCSEL is controlled by etching.

20 Claims, 28 Drawing Sheets

(51) Int. Cl.
*H01S 5/042* (2006.01)
*H01S 5/20* (2006.01)
*H01S 5/32* (2006.01)
*H01S 5/42* (2006.01)

(56) References Cited

U.S. PATENT DOCUMENTS

| | | | |
|---|---|---|---|
| 6,965,626 | B2 | 11/2005 | Tatum et al. |
| 7,186,302 | B2 | 3/2007 | Chakraborty et al. |
| 7,480,322 | B2 | 1/2009 | Feezell et al. |
| 7,504,274 | B2 | 3/2009 | Chakraborty et al. |
| 7,550,395 | B2 | 6/2009 | Hu et al. |
| 7,627,018 | B1 | 12/2009 | Guilfoyle et al. |
| 7,825,006 | B2 | 11/2010 | Nakamura et al. |
| 8,502,246 | B2 | 8/2013 | Chakraborty et al. |
| 2005/0214992 | A1 | 9/2005 | Chakraborty et al. |
| 2006/0270075 | A1 | 11/2006 | Leem |
| 2007/0111488 | A1 | 5/2007 | Chakraborty et al. |
| 2008/0247437 | A1* | 10/2008 | Koelle .................. 372/50.11 |
| 2009/0146162 | A1 | 6/2009 | Chakraborty et al. |
| 2009/0152565 | A1 | 6/2009 | Brandes et al. |
| 2009/0290610 | A1 | 11/2009 | Eichler et al. |
| 2010/0078672 | A1 | 4/2010 | Moriyama et al. |
| 2011/0073912 | A1 | 3/2011 | Marui et al. |
| 2011/0143467 | A1 | 6/2011 | Xiong et al. |
| 2011/0268143 | A1 | 11/2011 | Strittmatter et al. |
| 2013/0214284 | A1 | 8/2013 | Holder et al. |
| 2013/0264540 | A1 | 10/2013 | Chakraborty et al. |
| 2014/0003458 | A1* | 1/2014 | Han .......................... 372/45.01 |

OTHER PUBLICATIONS

Dwilinski, R., et al., "Bulk ammonothermal GaN", Journal of Crystal Growth, vol. 311, No. 10, pp. 3015-3018, May 2009.

Fujito, K., et al., "Bulk GaN crystals grown by HVPE", Journal of Crystal Growth, vol. 311, No. 10, pp. 3011-3014, May 2009.

Holder, C., et al., "Demonstration of Nonpolar GaN-Based Vertical-Cavity Surface-Emitting Lasers", Applied Physics Express 5 (2012), pp. 092104-1-092104-3.

Kelchner, K. M., et al., "Nonpolar AlGaN-Cladding-Free Blue Laser Diodes with InGaN Waveguiding", Applied Physics Express, vol. 2, No. 7, pp. 071003-1 to 071003-3, 2009.

Krames, M. R., et al., "Status and Future of High-Power Light-Emitting Diodes for Solid-State Lighting", Journal of Display Technology, vol. 3, No. 2, Jun. 2007, pp. 160-175.

Lu, T., et al., "CW lasing of current injection blue GaN-based vertical-cavity surface emitting laser", Applied Physics Letters 92, 141102 (2008), 141102-1-141102-3.

Omae, K., et al., "Improvement in Lasing Characteristics of GaN-based Vertical-Cavity Surface-Emitting Lasers Using a GaN Substrate", Applied Physics Express 2 (2009), pp. 052101-1-052101-3.

Raring, J. W., et al., "High-Efficiency Blue and True-Green-Emitting Laser Diodes Based on Non-c-Plane Oriented GaN Substrates", Applied Physics Express, vol. 3, No. 11, pp. 112101-1 to 112101-3, 2010.

Schubert, E. F. "Light-Emitting Diodes", 2nd ed., Cambridge University Press, Cambridge, Jul. 2006.

Shchekin, O. B., et al., "High performance thin-film flip-chip InGaN—GaN light-emitting diodes", Applied Physics Letters, vol. 89, No. 7, pp. 071109-1 to 071109-3, 2006.

Seurin, J. F., et al., "High-power high-efficiency 2D VCSEL arrays", Proc. of SPIE, vol. 6908 (2008), pp. 690808-1-690808-14.

Tamboli, A. C., et al., "Photoelectrochemical Undercut Etching of m-Plane GaN for Microdisk Applications", Journal of the Electrochemical Society, vol. 156, No. 10, pp. H767-H771, 2009.

Tamboli, A. C., et al., "Smooth Top-Down Photoelectrochemical Etching of m-Plane GaN", Journal of the Elecrochemical Society, vol. 156, No. 1, (2009), pp. H47-H51.

Tyagi, A., et al., "AlGaN-Cladding Free Green Semipolar GaN Based Laser Diode with a Lasing Wavelength of 506.4 nm", Applied Physics Express, vol. 3, No. 1, pp. 011002-1 to 011002-3, Jan. 2010.

Xu, J. J., et al., "1-8-GHz GaN-Based Power Amplifier Using Flip-Chip Bonding," Microwave and Guided Wave Letters, IEEE, vol. 9, No. 7, pp. 277-279, Jul. 1999.

PCT International Search Report and Written Opinion dated Dec. 9, 2013 for PCT Application No. PCT/US13/51498.

Onishi, T., et al., "Continuous Wave Operation of GaN Vertical Cavity Surface Emitting Lasers at Room Temperature", IEEE Journal of Quantum Electronics, Sep. 2012, pp. 1107-1112, vol. 48, No. 9.

* cited by examiner

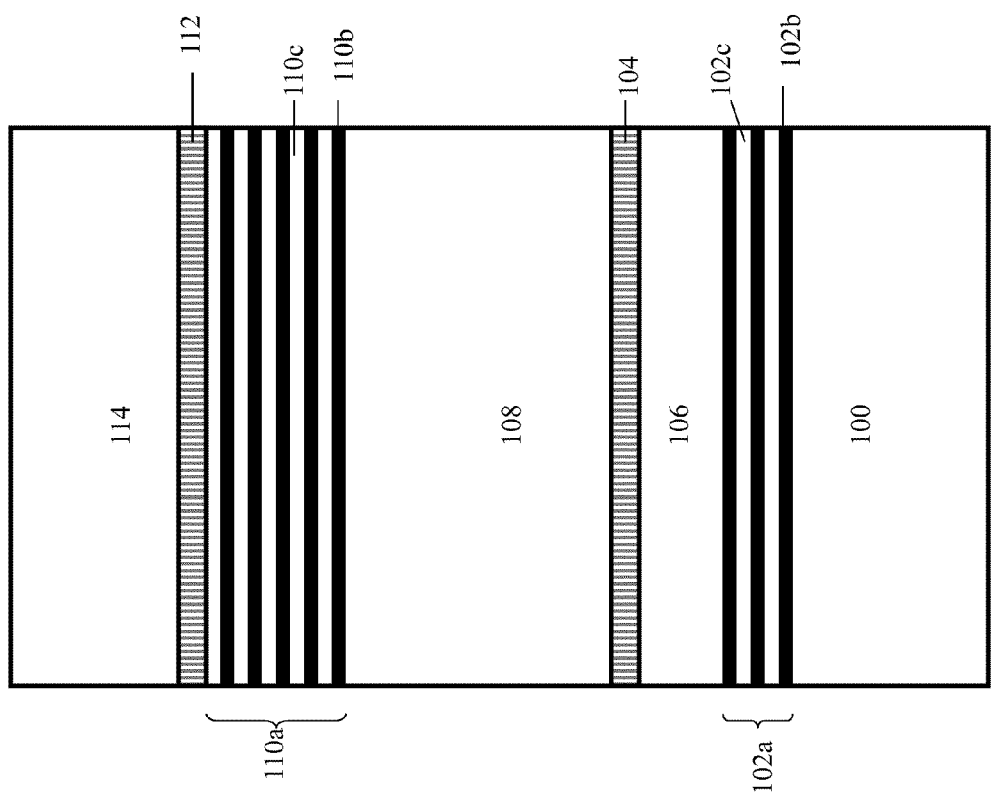

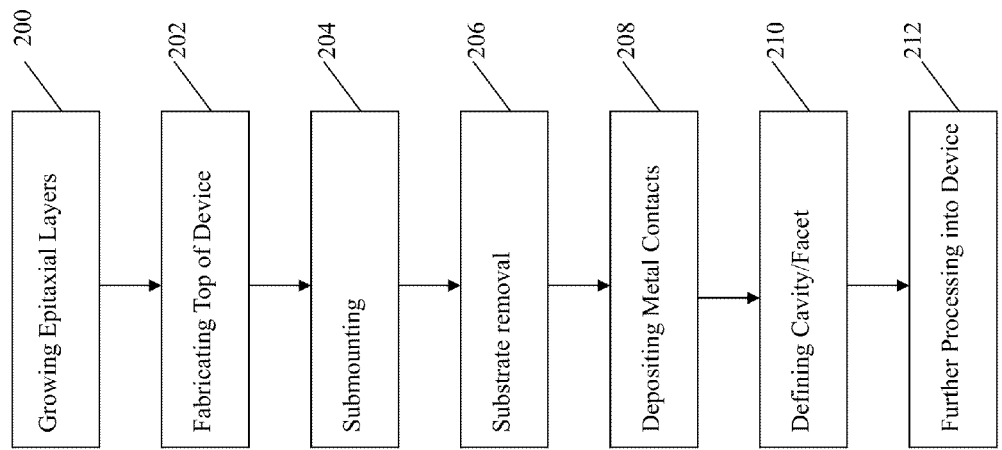

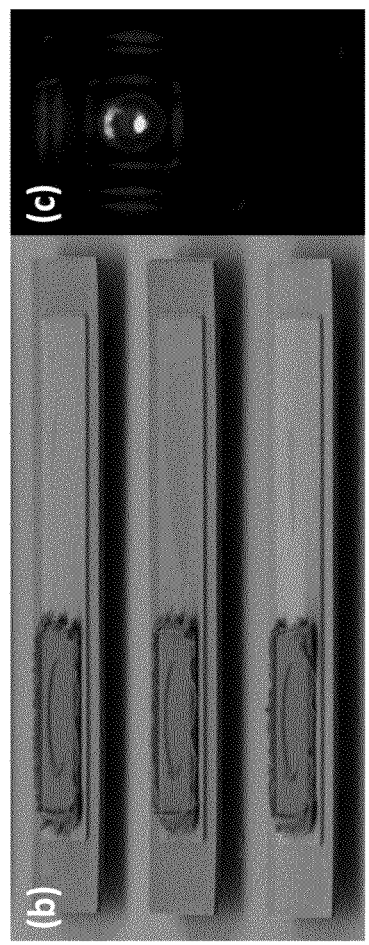

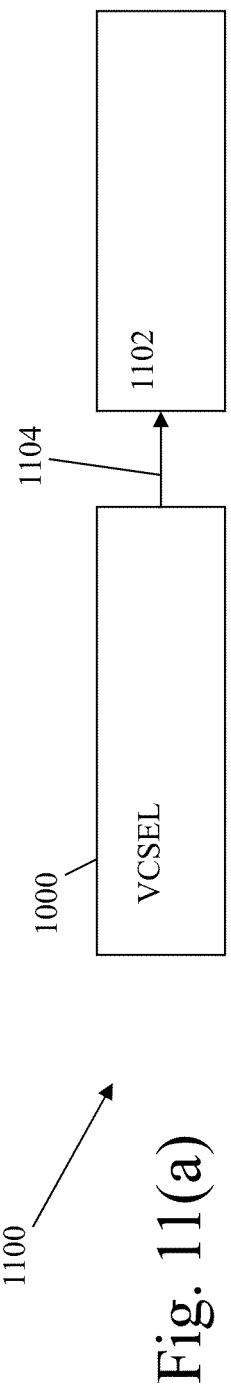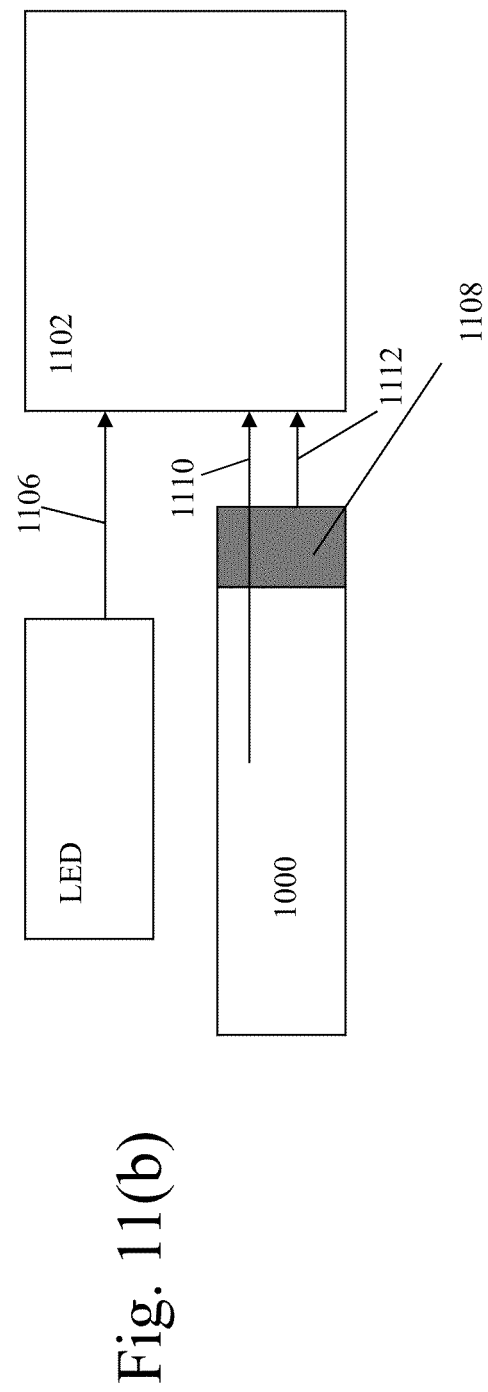
Fig. 11(a)
Fig. 11(b)

STRUCTURE AND METHOD FOR THE FABRICATION OF A GALLIUM NITRIDE VERTICAL CAVITY SURFACE EMITTING LASER

CROSS REFERENCE TO RELATED APPLICATIONS

This application claims the benefit under 35 U.S.C. Section 119(e) of the following and commonly assigned U.S. Provisional patent applications:

U.S. Provisional Patent Application Ser. No. 61/673,966, filed on Jul. 20, 2012, by Casey Holder, Daniel F. Feezell, Steven P. DenBaars, and Shuji Nakamura, entitled "STRUCTURE AND METHOD FOR THE FABRICATION OF A GALLIUM NITRIDE VERTICAL CAVITY SURFACE EMITTING LASER";

U.S. Provisional Patent Application Ser. No. 61/679,553, filed on Aug. 3, 2012, by Casey Holder, Daniel F. Feezell, James S. Speck, Steven P. DenBaars, and Shuji Nakamura, entitled "DEMONSTRATION OF NONPOLAR GAN BASED VERTICAL-CAVITY SURFACE-EMITTING LASERS";

U.S. Provisional Patent Application Ser. No. 61/673,985, filed on Jul. 20, 2012, by Casey Holder, Daniel F. Feezell, Steven P. DenBaars, and Shuji Nakamura, entitled "NONPOLAR AND SEMI-POLAR GALLIUM NITRIDE VERTICAL CAVITY SURFACE EMITTING LASER";

U.S. Provisional Patent Application Ser. No. 61/673,994, filed on Jul. 20, 2012, by Casey Holder, Daniel F. Feezell, Steven P. DenBaars, and Shuji Nakamura, entitled "POLARIZATION-LOCKED ARRAY OF GALLIUM NITRIDE VERTICAL CAVITY SURFACE EMITTING LASERS";

U.S. Provisional Patent Application Ser. No. 61/674,035 filed on Jul. 20, 2012, by Casey Holder, Daniel F. Feezell, Steven P. DenBaars, and Shuji Nakamura, entitled "SINGLE-LONGITUDINAL-MODE (AL,IN,GA)N VERTICAL-CAVITYSURFACE-EMITTING LASER";

U.S. Provisional Patent Application Ser. No. 61/674,003, filed on Jul. 20, 2012, by Casey Holder, Daniel F. Feezell, Steven P. DenBaars, and Shuji Nakamura, entitled "LIGHTING SYSTEM USING NON-POLAR AND SEMI-POLAR GALLIUM NITRIDE VERTICAL CAVITY SURFACE EMITTING LASERS";

U.S. Provisional Patent Application Ser. No. 61/674,012 filed on Jul. 20, 2012, by Casey Holder, Daniel F. Feezell, Steven P. DenBaars, and Shuji Nakamura, entitled "DISPLAY SYSTEM USING NON-POLAR AND SEMI-POLAR GALLIUM NITRIDE VERTICAL CAVITY SURFACE EMITTING LASERS"; and U.S. Provisional Patent Application Ser. No. 61/707,118 filed on Sep. 28, 2012, by Robert M. Farrell, Casey O. Holder, Steven P. DenBaars, and Shuji Nakamura, entitled "VIOLET III-NITRIDE NONPOLAR OR SEMIPOLAR VERTICAL-CAVITY SURFACE-EMITTING LASER FOR SOLID-STATE LIGHTING SYSTEMS";

all of which applications are incorporated by reference herein.

BACKGROUND OF THE INVENTION

1. Field of the Invention

This invention relates to a structure and method for the fabrication of a III-nitride Vertical Cavity Surface Emitting Laser (VCSEL).

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

One of the main difficulties in producing an (Al,In,Ga)N laser is the formation of Distributed Bragg reflector (DBR) mirrors, particularly the bottom mirror. Two differing approaches to this mirror have been taken: Nichia [1] and Panasonic [2] have used a flip-chip mounting method and then mechanical substrate removal to reveal a smooth facet for the application of a dielectric DBR mirror. This approach has the disadvantage of having very little control over cavity length. This can be alleviated, as demonstrated by Panasonic [2], by using very long cavity length, which results in a narrow longitudinal mode spacing such that there is always a longitudinal mode in alignment with the emission of the quantum well. This, however, makes single longitudinal mode operation impossible.

Another approach is to epitaxially grow a DBR mirror, as demonstrated by T-C Lu et al [3], who used AlN/GaN alternating periods to achieve a high reflectivity mirror. This approach provides precise control of cavity length, but the fabrication of such an epitaxial mirror is extremely difficult due to difficulties like relaxation, and costly due to the raw materials and time needed for such epitaxial growth.

Dielectric mirrors are much simpler to produce, so an approach that allows for precise control of cavity length (such as through epitaxial growth instead of mechanical polishing) with the simultaneous use of dielectric DBR mirrors would be ideal for (Al,In,Ga)N VCSEL fabrication. The present invention satisfies this need.

To date, there have been no public demonstrations of nonpolar or semipolar (Al,In,Ga)N VCSELs. Three groups, including Nichia [1], Panasonic [2], and National Chiao Tung University [3] have demonstrated electrically-injected c-plane (polar) (Al,In,Ga)N VCSELs. These devices have been demonstrated on c-plane GaN or c-plane sapphire and do not exhibit the polarization-locking properties of nonpolar and semipolar VCSELs.

SUMMARY OF THE INVENTION

The present invention comprises a novel device (and process for creating this device) comprised of (Al,In,Ga)N VCSELs fabricated on a nonpolar or semipolar crystal orientation (including, but not limited to, m-plane, a-plane, or 20-21, 20-2-1, 11-22 planes).

For example, the present invention discloses a method of fabricating a III-Nitride based VCSEL, comprising controlling or defining a cavity length of the VCSEL by (e.g., selective) etching, e.g., after at least partially removing a substrate on which the VCSEL is grown.

In one embodiment, the present invention comprises a novel method for fabricating a GaN VCSEL using photoelectrochemical (PEC) etching to expose the backside of the device and allow for the deposition of a dielectric backside DBR mirror. This is achieved through bandgap-selective PEC lateral etching of an epitaxially-grown sacrificial layer, which results in the removal of the substrate and leaves a smooth surface for the backside DBR.

Alternatively, PEC etching may be used to etch a deep via through a bulk GaN substrate to expose the backside of the cavity for DBR deposition, or in a bandgap-selective etch mode, to smooth the back facet formed through another method, such as manual lapping and polishing or PEC undercut substrate removal.

A method of the present invention can also encompass all processing steps required or that can be used for making an (Al,In,Ga)N VCSEL, including, for example, growth of the epitaxial layer structure, conventional photolithography for device patterning, dry etching for device definition and to reveal sacrificial lateral etch layers, metal deposition, n-type and p-type device contact formation using metal and/or Indium Tin Oxide (ITO) intracavity contact, dielectric deposition and patterning (for device isolation, sidewall protection/passivation, current/light aperture formation), flip chip bonding (such as Au/Au compression bonding, soldering, etc) and dielectric DBR deposition using alternating layers of dielectric materials. All processes may be done using various methods, including but not limited to, inductively-coupled plasma (ICP) etching, reactive ion etching (RIE), e-beam deposition, sputtering, ion beam deposition (IBD), plasma-enhanced chemical vapor deposition (PECVD), metalorganic chemical vapor deposition (MOCVD), wet etching, and lithography using contact or stepper-based exposure.

The method of the present invention can comprise providing, fabricating, or growing a III-nitride VCSEL structure on a III-nitride substrate and comprising an etch stop layer below an active region. The VCSEL structure can further comprise the aluminum containing etch stop layer placed between the active region and the substrate to define the VCSEL's cavity length; a p-type GaN layer, wherein the active region is between the p-type GaN layer and the aluminum containing etch stop layer; an Indium containing sacrificial layer below the active region between the substrate and the aluminum containing etch stop layer, and an n-type GaN layer that is part of the substrate or between the substrate and the aluminum containing etch stop layer.

The method can further comprise etching a mesa through the active region but stopping above the etch stop layer, to form a top surface of the epitaxial layers; coating the top surface of the epitaxial layers with dielectric material; etching an aperture in the dielectric material; patterning and depositing a transparent conductive layer on the dielectric material and in the aperture to contact the p-GaN layer in the aperture; and patterning and depositing metal (e.g., ring metal) on the transparent conductive layer, wherein the ring metal does not extend into the aperture.

The method can further comprise fabricating a first cavity mirror for the VCSEL on a first side of the VCSEL structure (e.g., depositing and patterning a first dielectric Distributed Bragg Reflector (DBR) on the ring metal).

After first cavity mirror fabrication, the method can further comprise attaching the VCSEL structure, at the first cavity mirror, to a submount. The attaching can comprise depositing pad metal on the first dielectric DBR, wherein (i) the pad metal makes n-type contact in a field around the first dielectric DBR to protect the first dielectric DBR during a subsequent etch, (ii) the pad metal coats a top of the first dielectric DBR for bonding to a submount in the subsequent flip-chip bonding process, and the pad metal is continuous from the top of the first dielectric DBR to the transparent conductive layer to inject current from the submount to the transparent conductive layer. The attaching can further comprise flip-chip bonding the submount to the top of the first dielectric DBR using the pad metal.

The method can further comprise at least partially removing the substrate on a second side of the VCSEL structure opposite the submount, e.g., by laterally photoelectrochemically etching the sacrificial layers to at least partially remove the substrate and leaving the n-type GaN layer. The method can further comprise patterning and depositing a metal n-contact on the n-type GaN layer after the substrate removal.

The method can further comprise (e.g., selectively) etching down to the etch stop layer to control or define the cavity length of the VCSEL. The aluminum containing etch stop layer can be positioned to define the cavity length such that the VCSEL has single mode operation or the cavity length is 3 micrometers or less.

After cavity length definition, the method can further comprise fabricating a second cavity mirror for the VCSEL on the second side of the VCSEL, wherein the first cavity mirror and the second cavity mirror define the VCSEL's laser cavity having the cavity length. The step can comprise depositing a second dielectric DBR on the aluminum containing stop etch layer and the metal n-type contact, wherein the light from the VCSEL is emitted through the second dielectric DBR.

The present invention also discloses a non-polar or semipolar III-nitride VCSEL fabricated on a non-polar or semipolar (e.g., III-nitride or GaN) substrate. The semipolar VCSEL can emit blue to green color light and the nonpolar VCSEL can emit ultraviolet (UV) to blue color light.

The VCSEL can have a cavity length of less than 3 nm.

The VCSEL can emit light with an output power of no less than 19.5 microwatts or at least 19.5 microwatts, above threshold. The VCSEL can emit light with a polarization ratio of no less than 0.72 or at least 0.72, above threshold. The VCSEL's light emission can have a full width at half maximum of 0.25 nm or less, or no more than 0.25 nm, above threshold.

For example, the present invention has fabricated and demonstrated working, electrically-injected, single-longitudinal mode (Al,In,Ga)N VCSELs which lase at room temperature, with locked polarization (e.g., naturally locked along the crystallographic a-direction of the device) and highly directional emission.

The present invention discloses a III-Nitride based (e.g., nonpolar or semipolar) VCSEL, comprising a cavity length controlled by (e.g., selective) etching, e.g., during/after at least partially removing a substrate on which the VCSEL is grown. An Aluminum (Al) containing layer in the VCSEL's epitaxial structure can be used as an etch stop layer for the etching. An Indium (In) containing layer in the VCSEL's epitaxial structure can be used as a sacrificial layer for the VCSEL's substrate removal by etching. The etching can be carried out by photoelectrochemical etching. The VCSEL can be grown on a nonpolar or semipolar substrate. A longitudinal mode of the VCSEL can be a single mode.

The present invention further discloses potential applications.

The polarization-locked (Al,In,Ga)N VCSELs of the present invention are due to the unique nature of nonpolar and semipolar (Al,In,Ga)N crystal orientations and the process used, which allows for the creation of a high-yield of these devices on one wafer. The nonpolar or semipolar VCSEL can be used as a light source, as the pump light source of a phosphor in a display or lighting system, or can be combined with Liquid Crystal On Silicon (LCOS), Liquid Crystal Display (LCD), Liquid Crystal Light Valve (LCLV) or Micro-Electro-Mechanical Systems (MEMS) components, for example.

BRIEF DESCRIPTION OF THE DRAWINGS

Referring now to the drawings in which like reference numbers represent corresponding parts throughout:

FIG. 2 is a flowchart illustrating a method of fabricating a VCSEL and defining a cavity/facet, according to one or more embodiments of the invention.

FIG. 4(b) is a Scanning Electron Microscope (SEM) image of multiple completed devices, and FIG. 4(c) is an optical microscope image of device lasing under pulsed operation, according to one or more embodiments of the present invention.

FIG. 11(a)-(b) illustrates a display system using one or more nonpolar or semipolar (Al,In,Ga)N VCSELs, according to one or more embodiments of the invention.

DETAILED DESCRIPTION OF THE INVENTION

Figure 1B:
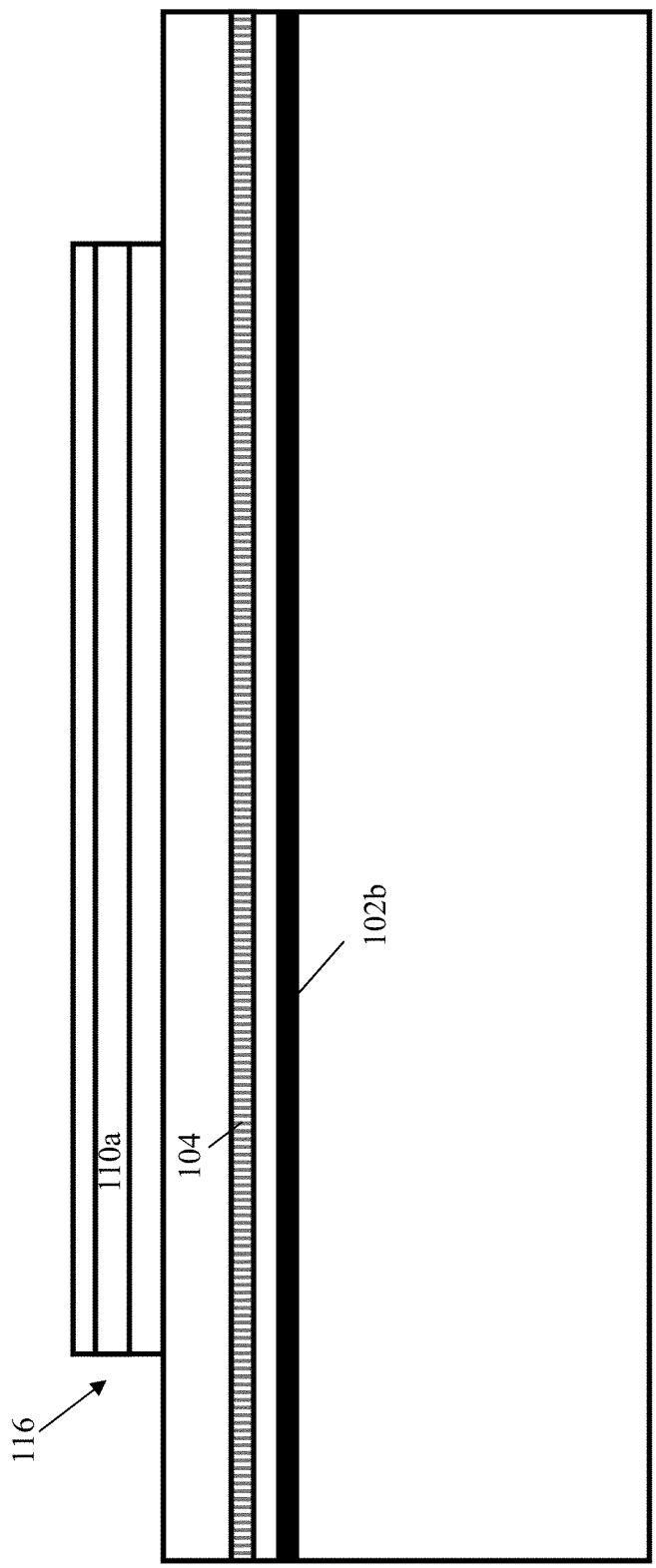
FIGS. 1(a)-(n) illustrate a method of fabricating a III-nitride VCSEL according an embodiment of the present invention, showing cross-sectional schematics of GaN epitaxial films, the active region comprising 1 to 15 InGaN quantum wells (2 to 15 nanometers (nm) thick) with quantum barriers 2 to 5 nm thick, a p-AlGaN electron blocking layer, a sacrificial layer (typically comprising 3×7 nm thick InGaN quantum wells and 5 nm thick GaN quantum barriers), and an n-AlGaN hole-blocking layer (typically 30% Al).

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

Vertical Cavity Surface-Emitting Lasers (VCSELs) offer several advantages over conventional edge-emitting lasers, including improved beam profile, high frequency operation, a small device footprint (allowing densely-packed arrays and the production of more devices per area of semiconductor wafer), and ease of on-wafer testing. Furthermore, the number of modes available within the gain bandwidth primarily determines the number of longitudinal lasing modes in a VCSEL. For sufficiently short (<3 micrometers) cavity lengths, the mode spacing becomes large (>10 nanometers (nm)) and the number of modes within the gain bandwidth reduces to one, allowing for devices with true single-longitudinal-mode operation. On the other hand, if the cavity is too long, diffraction and scattering introduce loss to the optical mode and the device efficiency is decreased.

VCSELs fabricated with conventional III-V materials (GaAs, InP) typically have well defined cavity lengths that can be controlled down to very small dimensions via the epitaxial growth of the intra-cavity layers and the distributed Bragg reflector (DBR) mirrors. This allows for well-controlled short cavities and ensures single-longitudinal mode operation, which is desirable for applications in which wavelength control and temperature stability are important.

The most challenging aspect of GaN VCSEL fabrication is the formation of distributed Bragg reflector (DBR) mirrors. In the (Al,In,Ga)N materials system, it is very difficult to achieve high reflectance DBR mirrors due to challenges associated with epitaxial growth that arise from lattice-mismatch induced strain. Gallium Nitride or (Al,In,Ga)N VCSELs, with possible applications in high-density optical storage, displays, printing, and biosensing, have previously been fabricated by thinning and polishing a GaN substrate to create the backside DBR mirror, or by epitaxially growing the backside DBR mirror.

Thinning/polishing gives very little cavity length control, which is essential for proper alignment of the laser cavity resonance with the gain spectrum. Furthermore, mechanical instability and damage inflicted during the thinning process place a lower bound on the cavity thickness. As a result, the longitudinal mode spacing remains small and single-mode operation is difficult to achieve, restricting these devices to multi-longitudinal mode operation [1]. Finally, epitaxial growth of DBR mirrors in the (Al,In,Ga)N materials system is extremely challenging.

In addition, due to challenges associated with epitaxial growth, these devices typically employ a dielectric bottom DBR, which requires the removal of the substrate and significantly complicates precise control of the cavity length, particularly down to small dimensions (<3 micrometers). For example, fabrication processes involving lapping and polishing of the substrate are limited to minimum cavity lengths of around 5 micrometers, which renders the VCSEL multi-longitudinal mode, because the mode spacing is relatively narrow (2-6 nm).

Dielectric mirrors are much simpler to produce, so an approach that allows for precise control of cavity length (such as through epitaxial growth instead of mechanical polishing) with the simultaneous use of dielectric DBR mirrors would be ideal for (Al,In,Ga)N VCSEL fabrication.

Photoelectrochemical (PEC) etching can provide such a method. By including a lower-bandgap sacrificial layer in the epitaxial growth at a defined place underneath the device, the substrate of the device can be removed to reveal a smooth bottom surface for dielectric DBR mirror deposition. Combined with a flip-chip bonding process to allow for further processing, this process can be used to precisely control cavity thickness by exact placement of the sacrificial layer within the epitaxial structure of the device. As such, dielectric DBR mirrors can be placed on a cavity with an epitaxially-controlled thickness for a laser operating with a single longitudinal mode. Alternatively, even in cases where a lateral PEC etch is not used to remove the substrate, a top-down bandgap-selective PEC stop-etch can still be used for very precise cavity length control of VCSELs formed by other methods, such as laser-liftoff of a substrate or mechanical polishing to thin a substrate.

The present invention describes a method for producing a III-nitride or (Al,In,Ga)N VCSEL, utilizing the unique abilities of PEC etching to achieve a device with superior performance. The present invention further describes the structure of the resulting device.

FIGS. 1(*a*)-(*n*) illustrates an example process flow for using a lateral PEC undercut etch for substrate removal and cavity length definition.

FIG. 1(*a*) shows epitaxial layers are grown homoepitaxially or heteroepitaxially on a suitable substrate 100, including but not limited to, bulk GaN (polar, nonpolar, or semipolar on any orientation), SiC, or sapphire. The epitaxial structure would typically include a lower-bandgap sacrificial region 102*a* comprising an Indium (In) containing layer 102*b* (e.g., $In_xGa_{1-x}N$ layer) underneath the device at a well-defined location, such that the location of the $In_xGa_{1-x}N$ layer 102*b* would define the length of the vertical cavity to be ideally suited for the desired VCSEL device.

This lower-bandgap material 102*b* would typically be $In_xGa_{1-x}N$ of variable compositions, such that it could be selectively etched by a suitable light source, such as a filtered broadband source or a narrow-emission light source.

The Indium (In) containing layer should be preferred for the lower-bandgap sacrificial layer 102*b* because it is easier to etch out the sacrificial layer by etching. This sacrificial region 102*a* could be a single layer or a set of several layers 102*b*, of any thickness. In addition, this selective etching is more preferred for a nonpolar or semipolar VCSEL, because the quantum-confined Stark effect (QCSE) limits the thickness of sacrificial layers that can be used with polar/c-plane sacrificial layers. In polar/c-plane devices, the built-in electric field that is perpendicular to the sacrificial layer separates the electrons and holes to opposite sides of the layer. Since it is holes that participate in PEC etching, this causes non-uniform etching in polar/c-plane sacrificial layers, so layer thicknesses must be kept very thin to compensate. Thus, superlattices must be used and the etching rate may suffer due to the thin sacrificial layers used: lower surface area and increased aspect ratio during lateral etching can both limit etching rate. Nonpolar and semipolar planes limit the QCSE in the sacrificial layers (remove it completely in the case of nonpolar), and thereby remove the design restrictions placed on the sacrificial layer by QCSE in the polar/c-plane devices.

FIG. 1(*a*) also illustrates a specific example of an epitaxial structure, showing sacrificial undercut InGaN layers 102*b* (7 nm thick quantum wells having 5 nm thick GaN barriers 102*c*, forming a 3 period InGaN/GaN Multi Quantum Well (MQW) absorbing at a peak wavelength of ~415 nm), and an AlGaN stop-etch layer 104 (a 15 nm thick n-type AlGaN Hole Blocking Layer/Stop-etch layer with 30% Al composition). The epitaxial structure of FIG. 1(*a*) further illustrates the lower bandgap sacrificial region 102*a* on an n-type GaN (n-GaN) template 100 or substrate, a 50 nm thick GaN layer 106 between the lower bandgap sacrificial region 102*a* and the AlGaN stop-etch layer 104, a 902 nm thick n-GaN layer 108 between the AlGaN layer 104 and the active region 110*a* (comprising a 5 period InGaN/GaN MQW, including 7 nm thick InGaN quantum wells 110*b* with 5 nm thick GaN barriers 110*c*, emitting at a peak wavelength of 405 nm), a 15 nm thick p-type AlGaN electron blocking layer (EBL) 112 with 20% Al composition on the active region 110*a*, and a 127 nm thick p-type GaN (p-GaN) and/or $p^{++}$ contact layer 114 on the EBL 112.

In other examples, the active region 110*a* comprises 1 to 15 InGaN quantum wells 110*b* that are 2 to 15 nm thick, having quantum barriers 110*c* that are 2 to 5 nm thick.

The top of the device would be fabricated according to the specifications of the device, including making electrical contacts to the device, etching to define mesas and other features, dielectric deposition for sidewall passivation or current confinement, deposition of a DBR mirror, and bonding to a suitable submount, for example a silicon wafer. Examples of these fabrication steps are illustrated in FIG. 1(*b*)-(*i*).

FIG. 1(*b*) illustrates a first step, dry etching a mesa 116 through the active region 110*a* but stopping above sacrificial layers 102*b*.

FIG. 1(*c*) illustrates a second step, blanket coating the wafer 118 with dielectric material 120, typically Silicon Nitride (SiN), and etching an aperture 122 in the dielectric material 120 to allow for current injection.

FIG. 1(*d*) illustrates a third step, patterning and depositing a transparent conductive layer or Indium Tin Oxide (ITO) intracavity contact 124 on the dielectric material 120 and the p-GaN 114 (e.g., by performing a wet etch, dry etch, or liftoff). The contact 124 must contact the p-GaN 114 in the aperture 122, and be continuous outwards for receiving p-contact metal 126 deposited on the contact 124 in a later step illustrated in FIG. 1(*f*).

FIG. 1(*e*) illustrates a fourth step, dry etching down to reveal sidewalls 128 of the sacrificial layer 102*b*. Placement of this step in the process is not critical, and can be anywhere from the $3^{rd}$ to $6^{th}$ step.

FIG. 1(*f*) illustrates a fifth step, patterning and depositing metal 126 (e.g., ring metal 126) for p-contact to the ITO 124, wherein the ring metal 126 does not extend into the aperture 122 but extends out for metal contact to metal pad 130 formed in FIG. 1(*h*).

FIG. 1(*g*) illustrates a sixth step, depositing and patterning a dielectric DBR 132. Typically the DBR comprises $Ta_2O_5$/$SiO_2$ alternating layers, but the DBR 132 could also be $SiO_2$/SiN, $SiO_2$/$TiO_2$, $SiO_2$/$Nb_2O_5$, etc. In one embodiment, the DBR material and structure is such that the DBR 132 has >99% reflectivity at the target emission wavelength for the laser diode.

FIG. 1(*h*) illustrates a seventh step, comprising depositing pad metal 130. The step includes 3 features: (1) the pad metal 130 must make n-contact in the field 134 around the mesa 136, to protect the mesa 136 and/or DBR 132 during the PEC etch to follow, (2) the pad metal 130 must coat the top 138 of the DBR 132 for bonding to a submount 142 in a flip-chip bonding process, and (3) the pad metal 130 must be continuous from the top 138 of the DBR 132 to the bottom 140 of the DBR 132 to inject current from the submount 142 (deposited in FIG. 1(*i*)) to the ITO contact 124.

FIG. 1(*i*) illustrates flip-chip bonding the submount 142 to the top 138 of DBR 132 using the metal 130 on the top 138 of the DBR 132. The bonding can include a Au/Au compression bond, solder reflow, or many other bonding types. FIG. 1(*j*) illustrates the bonded structure formed in FIG. 1(*i*) flipped upside-down.

FIG. 1(*k*) illustrates substrate 100 removal through a lateral PEC etch of the sacrificial region 102*a*. In this step, the sample/device 144 can be submerged in any appropriate electrolyte solution (including, but not limited to, KOH, HCl, $HNO_3$, etc.), and exposed to light that is above the bandgap of the $In_xGa_{1-x}N$ sacrificial layer 102*b*, but below the bandgap of GaN. The latter condition is a requirement that allows for PEC etching of the $In_xGa_{1-x}N$ sacrificial layer 102*b* while preventing undesirable etching of other surrounding layers, such as the GaN substrate 100. This light could come from any source, including narrow-emission sources like lasers or Light Emitting Diodes (LEDs), or filtered broadband sources like a Xe lamp with a long-pass filter (using GaN itself as a filter will allow for any composition of $In_xGa_{1-x}N$ to be etched while not allowing etching of GaN). The sacrificial $In_xGa_{1-x}N$ layers 102*b* will etch laterally, and after some time will be completely removed (e.g., undercut), freeing the substrate 100 from the individual devices 144 that were bonded to a carrier substrate 142. The etch process may or may not include an applied bias or temperature control, which can assist in the etch process.

Here, only photo-enhanced chemical or PEC etching was described. However, all kinds of etching without photo-enhancement or light irradiation could be applied to remove the sacrificial layer 102*b*.

After substrate 100 removal, the devices 144 (mounted on a carrier 142) can be further processed according to the desired device. This would typically include metal contacts to inject current (as shown in FIG. 1(*l*), which illustrates patterning and depositing a metal n-contact 146), and the patterning of an additional dielectric DBR mirror 148, as illustrated in FIG. 1(*m*) and FIG. 1(*n*).

FIG. 1(*m*) illustrates a second PEC etch, comprising bandgap a selective stop-etch down through the n-GaN 106 to the AlGaN Hole Blocking Layer (HBL) 104 for precise cavity length control.

FIG. 1(*n*) illustrates depositing a light emitting DBR 148, wherein the light emitting DBR 148 is slightly less reflective than non-emitting DBR 132.

Through this process, the cavity length 150 of the device 152 is precisely controlled by the epitaxial growth of the device through the placement of the sacrificial $In_xGa_{1-x}N$ layer 102*b*, while the expense and difficulty of fabricating epitaxially-grown DBR mirrors is avoided. Additionally, such precise control of cavity length (as opposed to mechanical polishing, which gives very little control over final thickness) allows for consistent single longitudinal mode operation of the VCSEL with a high device yield, without having to resort to thick cavities that do not allow single longitudinal mode operation.

Facet Formation/Cavity Length Definition

Another application of PEC etching is for cavity length control of (Al,In,Ga)N VCSELs, comprising a top-down stop etch for facet formation and cavity length definition.

A schematic example process flow is shown in FIGS. 1(*a*)-(*n*). In the given example illustrated in FIGS. 1(*a*)-(*n*), both PEC etch methods (substrate removal and facet formation/cavity length definition) are demonstrated together, but that is not a requirement of the present invention. It is merely more convenient to combine the schematics for both possible embodiments.

The following is an example of how facet formation/cavity length definition could be applied, as illustrated in FIG. 2 and in further reference to FIGS. 1(*a*)-(*n*).

Block 200 represents obtaining or growing epitaxial layers homoepitaxially or heteroepitaxially on a suitable substrate (e.g., as illustrated in FIG. 1(*a*)). Suitable substrates include, but are not limited to, bulk GaN (polar, nonpolar, or semipolar on any orientation), SiC, or sapphire. The epitaxial structure would typically include a higher bandgap material, such as $Al_xGa_{1-x}N$ of some appropriate composition x (e.g., AlGaN layer 104 in FIG. 1(*a*)), underneath the device at a well-defined location, such that the location of the $Al_xGa_{1-x}N$ would correspond to a length of the vertical cavity and would be ideally suited for the desired VCSEL device. This higher-bandgap layer could be a single layer, or could comprise of multiple layers, such as a superlattice.

Block 202 represents the top of the device would be fabricated according to the specifications of the device, including making electrical contacts to the device, etching to define mesas (e.g., FIG. 1(*b*)) and other features, dielectric deposition for sidewall passivation or current confinement (e.g., FIG. 1(*c*), deposition of a DBR mirror (e.g., FIG. 1(*g*)), and bonding to a suitable submount (e.g., FIG. 1(*i*), for example a silicon wafer. Such a process could be the same as seen in the embodiment above, or could be the same as seen in references [1] and [2].

After suitable submounting, as illustrated in Block 204, Block 206 represents the substrate is either thinned or removed through any number of appropriate methods, including laser liftoff of sapphire substrates, mechanical thinning/polishing, etching by wet or dry techniques, laser ablation, or even PEC lateral undercut etching, as discussed above (e.g., FIG. 1(*k*)). This thinning, etching, or substrate removal should happen below the $Al_xGa_{1-x}N$ region 104, such that the $Al_xGa_{1-x}N$ region remains completely intact. Alternatively, for a bulk GaN substrate, bonding and thinning or substrate removal may not be required, as the following PEC etch step may be done through the entire substrate.

Block 208 represents metal contacts are then patterned onto the exposed rear surface of the device.

Block 210 represents etching for facet formation/cavity length definition, wherein the sample could then be submerged in any appropriate electrolyte solution (including, but not limited to, KOH, HCl, $HNO_3$, etc.), and exposed to light that is above the bandgap of GaN, but below the bandgap of the $Al_xGa_{1-x}N$ stop-etch layer. The latter condition is a requirement that allows for etching of the GaN while not etching the $Al_xGa_{1-x}N$ stop-etch layer. This light could come from any source, including narrow-emission sources like lasers or LEDs, or filtered broadband sources like a Xe lamp with a long-pass filter. The etch process may or may not include an applied bias or temperature control, which can assist in the etch process.

Block 212 represents the devices (mounted on a carrier) can be further processed according to the desired device. This would typically include metal contacts (e.g., 146 in FIG. 1(*l*)) to inject current (if the metal contacts formed prior to the PEC etch are not sufficient for device operation), and the patterning of an additional dielectric DBR mirror (e.g., FIG. 1(*m*) and FIG. 1(*n*)).

Through this process, a smooth surface is formed, with the Al$_x$Ga$_{1-x}$N stop-etch region 104 forming the smooth facet of the device. As such, the cavity length of the overall device is precisely controlled by the placement of the Al$_x$Ga$_{1-x}$N region 104 during epitaxial growth of the device.

Through this process, the cavity length of the device is precisely controlled by the epitaxial growth of the device through the placement of the Al$_x$Ga$_{1-x}$N region 104, but the expense and difficulty of fabricating epitaxially-grown DBR mirrors is avoided. Additionally, such precise control of cavity length (as opposed to mechanical polishing, which gives very little control over final thickness) allows for consistent single longitudinal mode operation of the VCSEL with a high device yield, without having to resort to thick cavities that do not allow single longitudinal mode operation.

Figure 3:
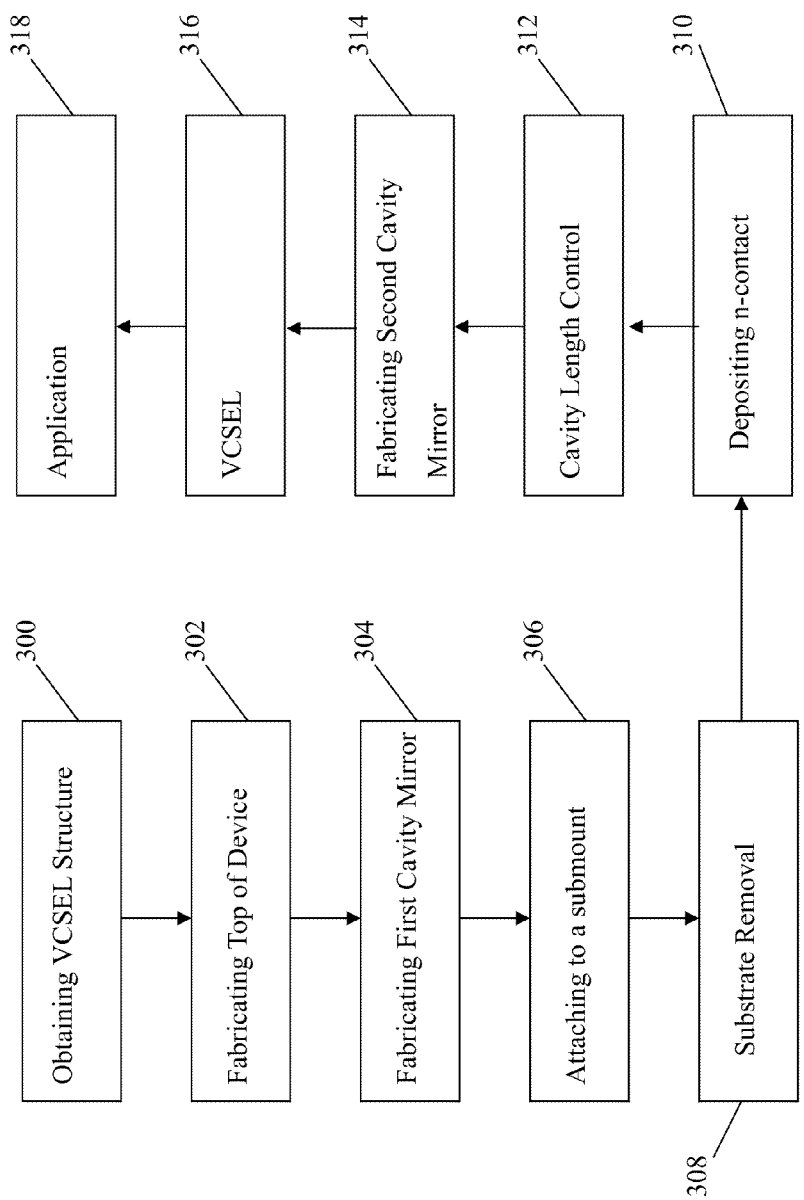
FIG. 3 is a flowchart illustrating a method of fabricating a VCSEL, according to one or more embodiments of the invention.

FIG. 3 illustrates a method of fabricating a III-Nitride based VCSEL, comprising controlling or defining a cavity length of the VCSEL by etching (e.g., selective etching) e.g., during/after at least partially removing the substrate upon which the VCSEL structure is grown.

Block 300 represents obtaining, providing, fabricating, or growing a III-nitride VCSEL structure on a III-nitride substrate, the VCSEL structure comprising an etch stop layer below an active region. The substrate can be a nonpolar or semipolar substrate, or the VCSEL can be grown on a non-polar or semipolar surface of the substrate (e.g., III-nitride or GaN substrate).

For example, the step can comprise obtaining or growing epitaxial layers epitaxially on a nonpolar or semipolar surface of a III-nitride substrate to form a VCSEL structure, the VCSEL structure comprising an active region; an aluminum containing etch stop layer placed between the active region and the substrate to define the VCSEL's cavity length; a p-type GaN layer, wherein the active region is between the p-type GaN layer and the aluminum containing etch stop layer; and an n-type GaN layer that is part of the substrate or between the substrate and the aluminum containing etch stop layer. The VCSEL structure can comprise one or more sacrificial layers containing indium below the active region, between the substrate and the aluminum containing etch stop layer. The VCSEL structure can be the structure of FIG. 1(*a*), for example.

Block 302 represents fabricating the top of the device. The step can comprise etching a mesa through the active region but stopping above the etch stop layer, to form a top surface of the epitaxial layers; coating the top surface of the epitaxial layers with dielectric material; etching an aperture in the dielectric material; patterning and depositing a transparent conductive layer on the dielectric material and in the aperture to contact the p-GaN layer in the aperture; and patterning and depositing metal (e.g., ring metal) on the transparent conductive layer, wherein the (e.g., ring) metal does not extend into the aperture. The steps can be as shown in FIGS. 1(*b*)-(*f*), for example.

Block 304 represents fabricating a first cavity mirror for the VCSEL on a first side of the VCSEL structure, e.g., as shown in FIG. 1(*g*). The step can comprise depositing and patterning a first dielectric Distributed Bragg Reflector (DBR) on the ring metal.

Block 306 represents attaching the VCSEL structure, at the first cavity mirror, to a submount. The step can comprise depositing pad metal on the first dielectric DBR, wherein: the pad metal makes n-type contact in a field around the first dielectric DBR to protect the first dielectric DBR during a subsequent etch, the pad metal coats a top of the first dielectric DBR for bonding to a submount in a subsequent flip-chip bonding process, and the pad metal is continuous from the top of the first dielectric DBR to the transparent conductive layer to inject current from the submount to the transparent conductive layer. The step can further comprise flip-chip bonding the submount to the top of the first dielectric DBR using the pad metal. The steps can be as shown in FIGS. 1 (*g*)-(*h*).

Block 308 represents optionally at least partially removing the substrate, e.g., leaving the n-type GaN layer (e.g., as shown in FIG. 1(*k*)). The substrate can be removed by etching. An Indium (In) containing layer in the VCSEL structure can be used as a sacrificial layer for the substrate removal by (e.g., selective) etching. The substrate can be removed on a second side of the VCSEL structure opposite the submount. The etching (e.g., selective etching) can be carried out by PEC etching.

Block 310 represents patterning and depositing a metal n-contact on the n-type GaN layer (if necessary).

Block 312 represents (e.g., selectively) etching the VCSEL structure to control a cavity length of the VCSEL, e.g., as shown in FIG. 1(*m*). An Aluminum (Al) containing layer in the VCSEL structure can be used as an etch stop layer for the (e.g., selective) etching to control the cavity length. The (e.g., selective) etching can be carried out by photoelectrochemical (PEC) etching. The step can comprise selectively etching down to the Aluminum containing etch stop layer, to control or define the cavity length of the VCSEL, e.g., such that the VCSEL has single mode operation or the cavity length is 3 micrometers or less.

Block 314 represents fabricating a second cavity mirror for the VCSEL on a second side of the VCSEL opposite the first side, wherein the first cavity mirror and the second cavity mirror define the VCSEL's laser cavity having the cavity length, e.g., as shown in FIG. 1(*n*). The step can comprise depositing a second dielectric DBR on the aluminum containing stop etch layer and the metal n-type contact, wherein the light from the VCSEL is emitted through the second dielectric DBR.

Block 316 represents the end result, a III-Nitride based VCSEL. The VCSEL can comprise a cavity length controlled and/or defined and/or formed by (e.g., selective) etching (e.g., of epitaxial layers of the VCSEL structure). The etching or selective etching can be during and/or after partially or totally removing the substrate.

The semipolar VCSEL can have an active region comprising an indium composition/material bandgap that emits from blue to green color. The nonpolar VCSEL can have an active region comprising an indium composition/material bandgap that emits from Ultraviolet (UV) to blue color. The semipolar/nonpolar VCSEL can have an active region comprising an indium composition/material bandgap that emits radiation/light having a peak intensity at one or more wavelengths in a range from ultraviolet to red. The VCSEL can be grown on a non-polar m-plane substrate and light emitted by VCSEL can be polarization-locked along an a-direction of the VCSEL. The VCSEL can be grown on a semi-polar substrate, such as a (20-21) or (20-1-1) substrate, and light emitted by VCSEL can be polarization-locked along an a-direction of the VCSEL.

Figure 5:
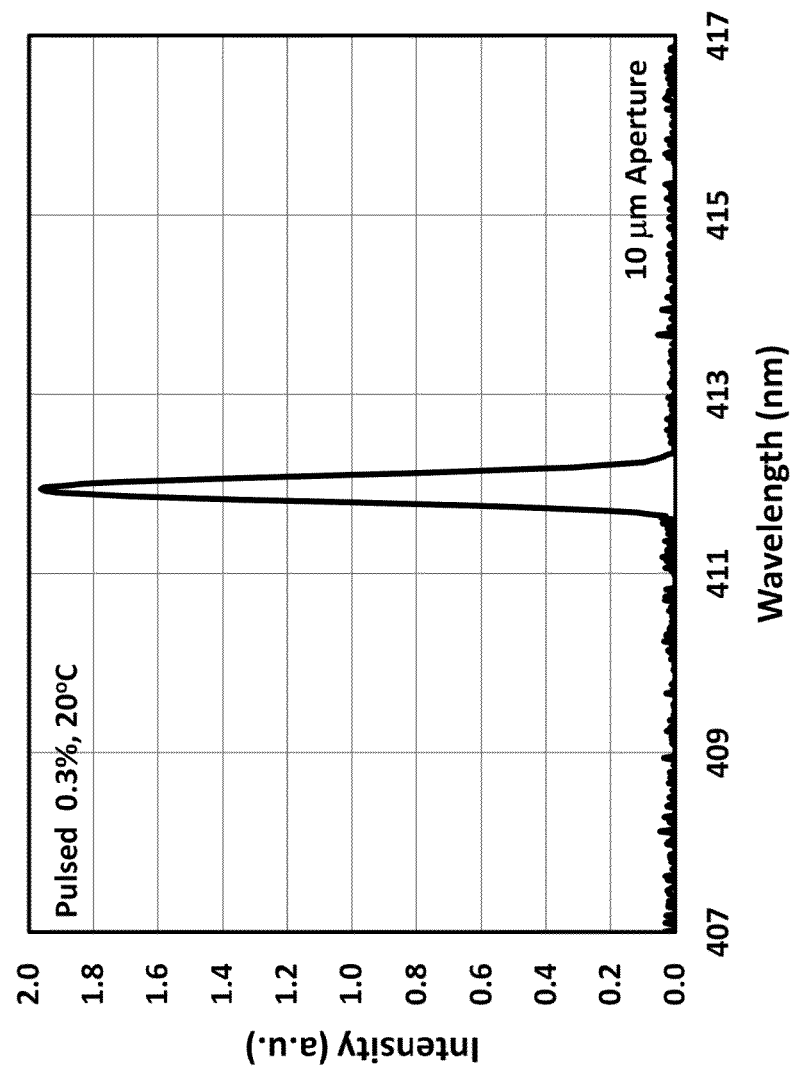
FIG. 5 is a lasing spectrum, plotting output intensity in arbitrary units (a.u.) vs. emission wavelength (nm), of a working device fabricated using the method of FIGS. 1(a)-(n) and having the structure of FIG. 4(a), wherein the device has a 10 micrometer (μm) diameter aperture and the graph is obtained for the device operating at a duty cycle of 0.3% and at a temperature of 20° C.
Figure 6:
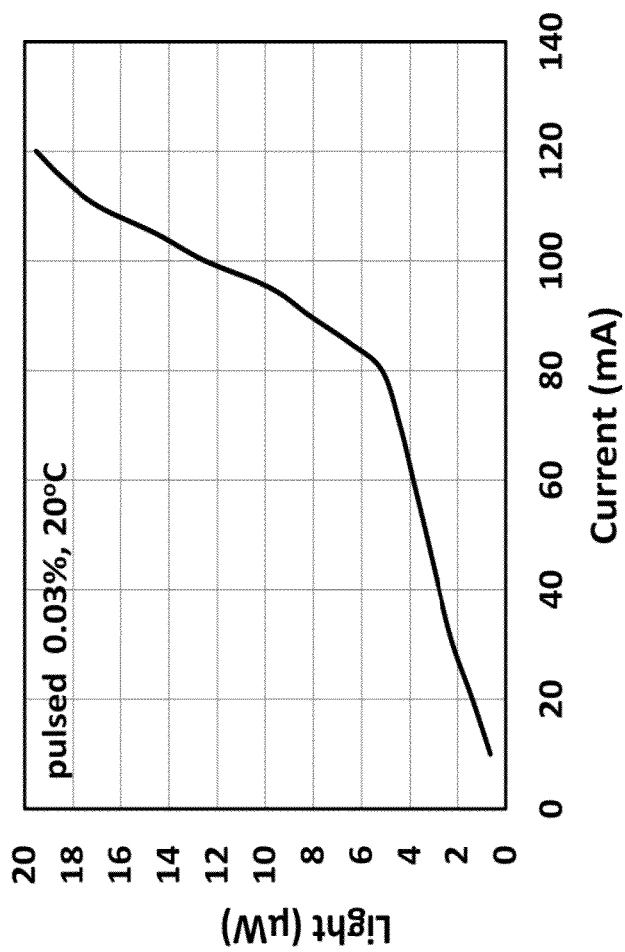
FIG. 6 is a current vs. light (L-I) curve, plotting light output power in microwatts (μW) vs. drive current in milliamps (mA), of a working device fabricated using the method of FIGS. 1(a)-(n) and having the structure of FIG. 4(a), wherein the device has a 10 μm diameter aperture, the graph is obtained for the device driven with 30 ns pulses at a duty cycle of 0.03% at a temperature of 20° C., and the graph shows a peak output power is 19.5 μW and the threshold current is 70 mA.

The VCSEL's light emission can have a full width at half maximum of no more than 0.25 nm above threshold (see FIG. 5), the VCSEL can emit light with an output power of no less than 19.5 microwatts or at least 19.5 microwatts, above threshold (e.g., at a drive current of no more than 120 milliamps), as shown in FIG. 6, and/or the VCSEL can emit light with a polarization ratio of no less than 0.72 or at least 0.72, above threshold (e.g., at a drive current of no more than 120 milliamps), as shown in FIG. 7(*a*).

Block 318 represents optionally incorporating the VCSEL in an application. This VCSEL could be used as a high quality light source (e.g., polarized light source) for a number of applications, including projectors, backlighting displays, scientific applications that require high quality coherent light sources, optical data storage (e.g., high density optical storage), high-resolution or laser printing, and biosensing, as described below.

Applications that would benefit from polarization-locked VCSEL arrays include those which require polarized light in an intensity greater than that which can be produced by a single VCSEL.

The nonpolar or semipolar VCSEL can be used for the application of all kinds of sensors with an advantage of light polarization that is locked effectively along a certain direction (e.g., along an a-direction or effectively perpendicular to a c-direction of the III-nitride device).

Results

Figure 1C:
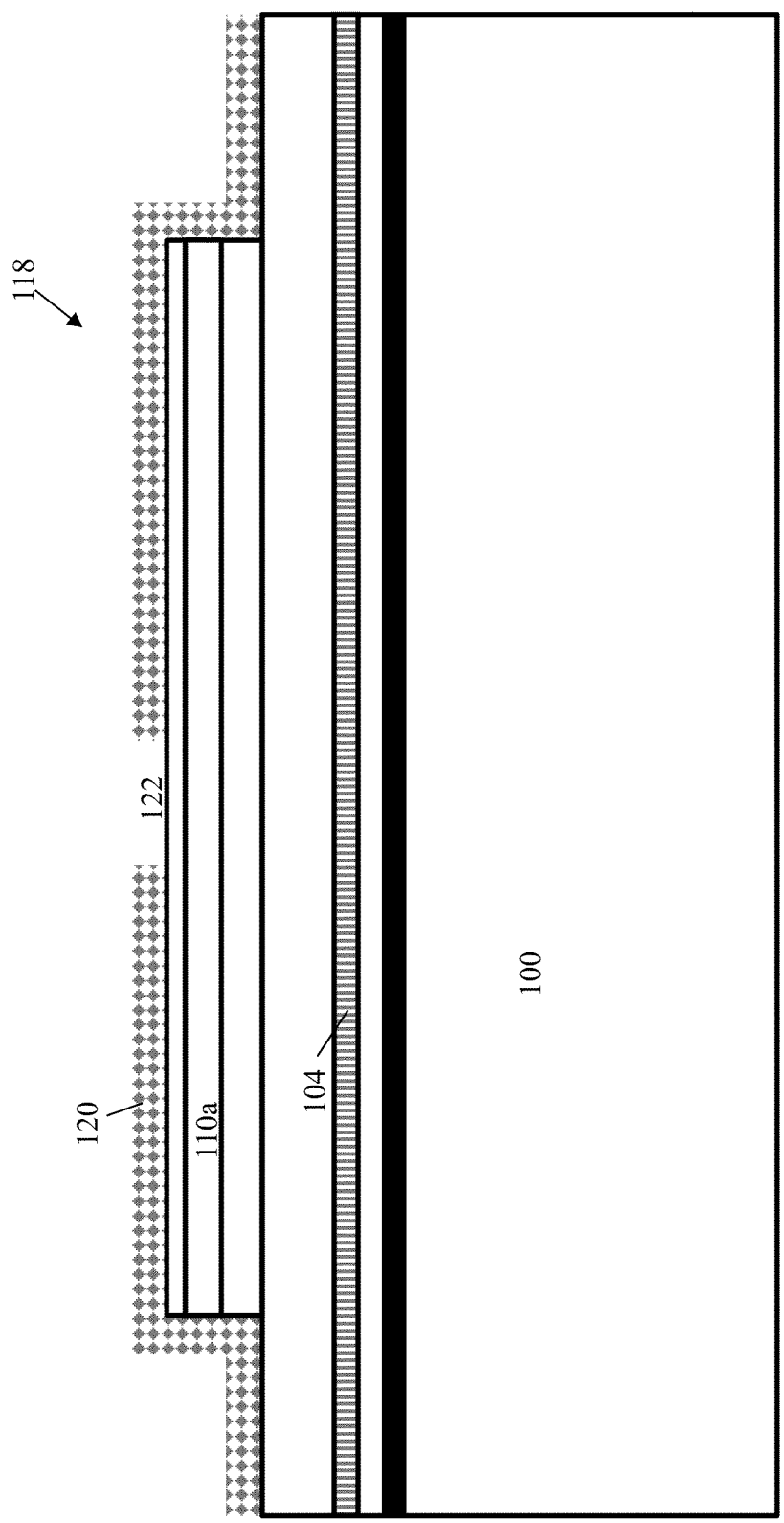
Figure 1D:
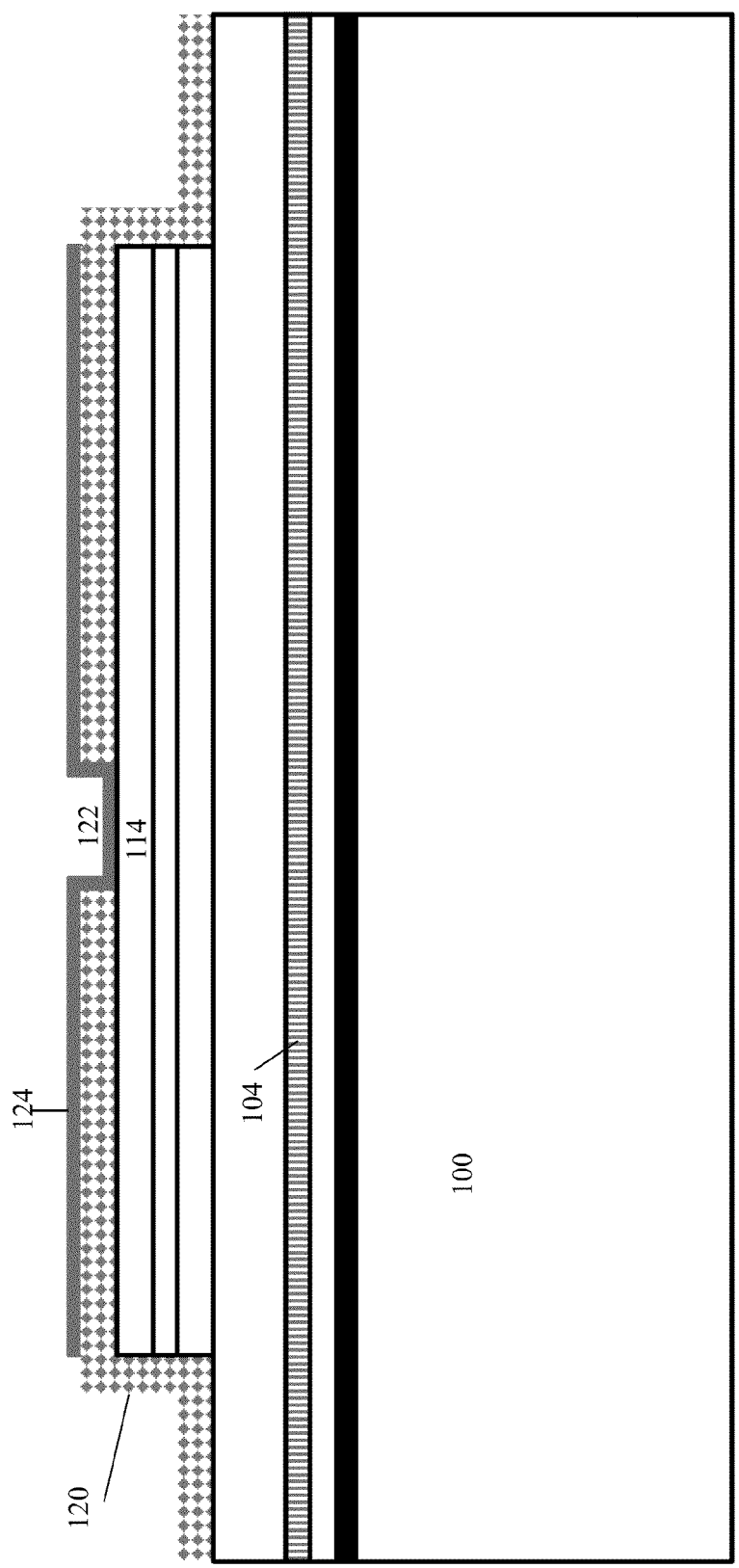
Figure 1E:
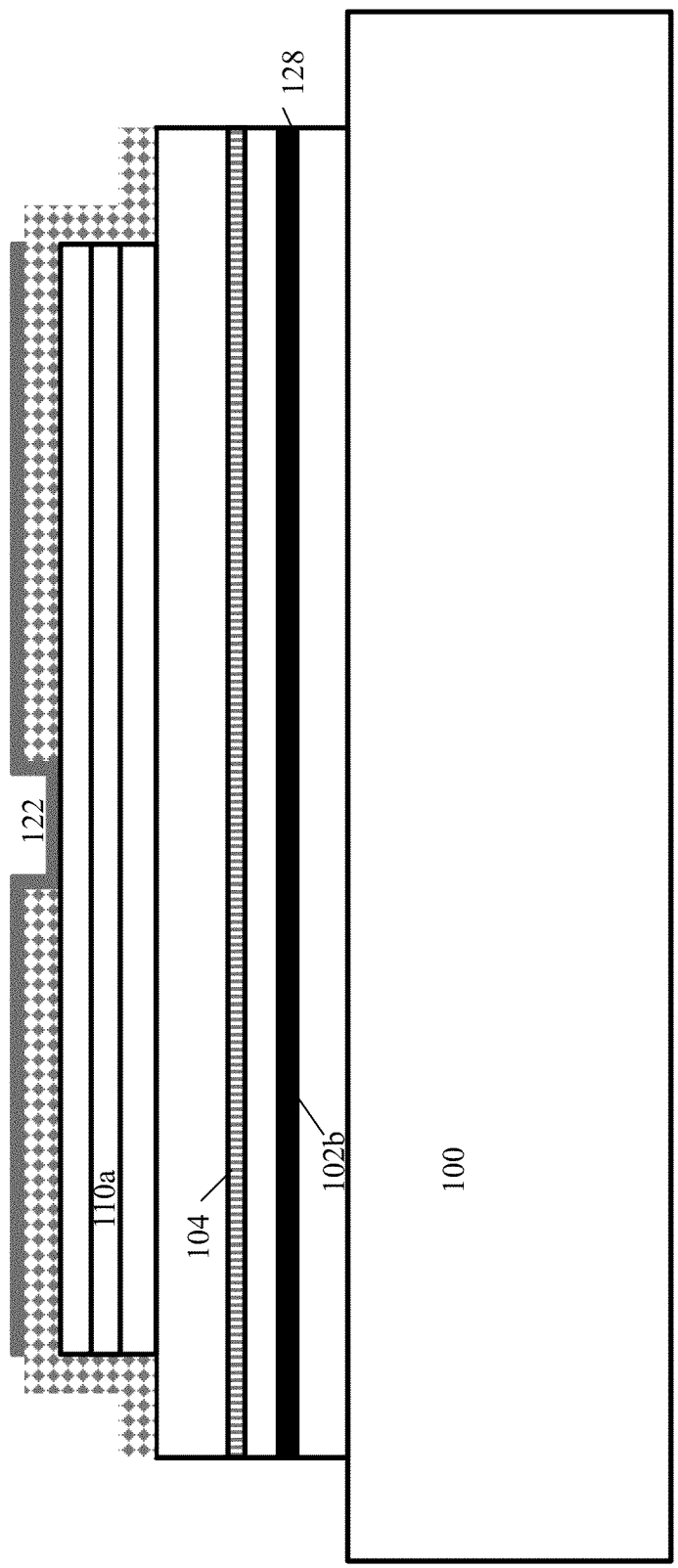
Figure 1F:
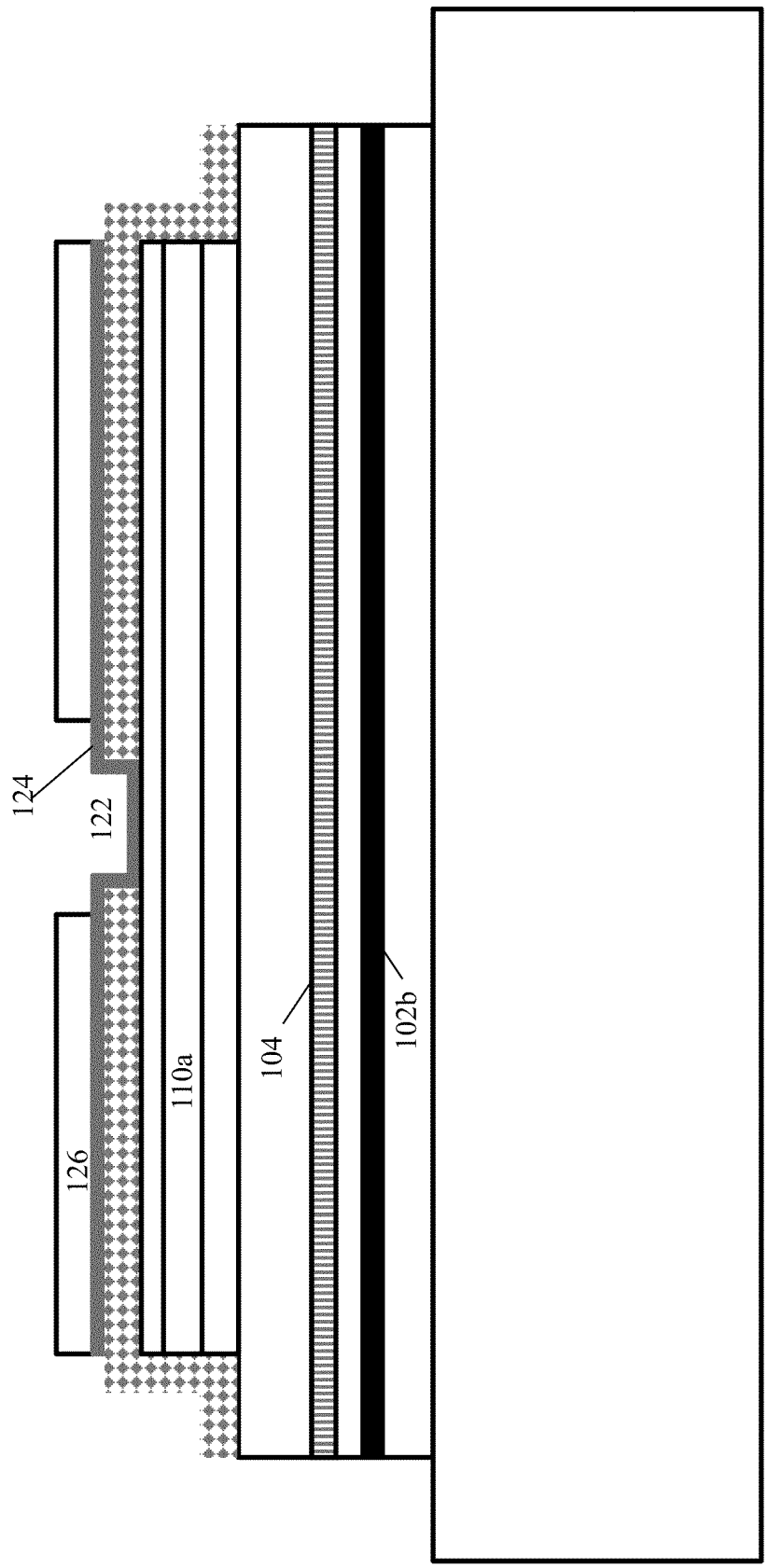
Figure 1G:
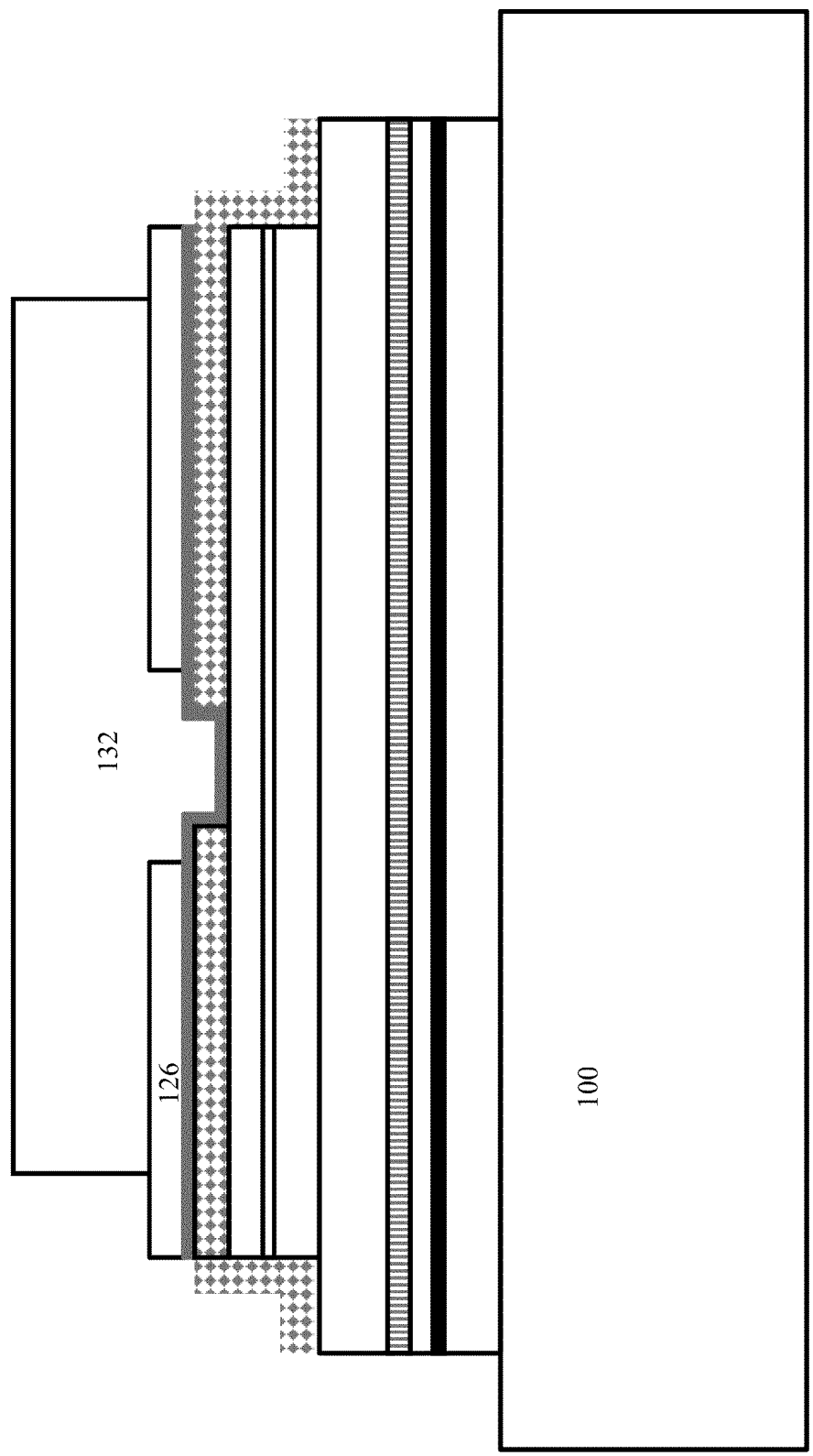
Figure 1H:
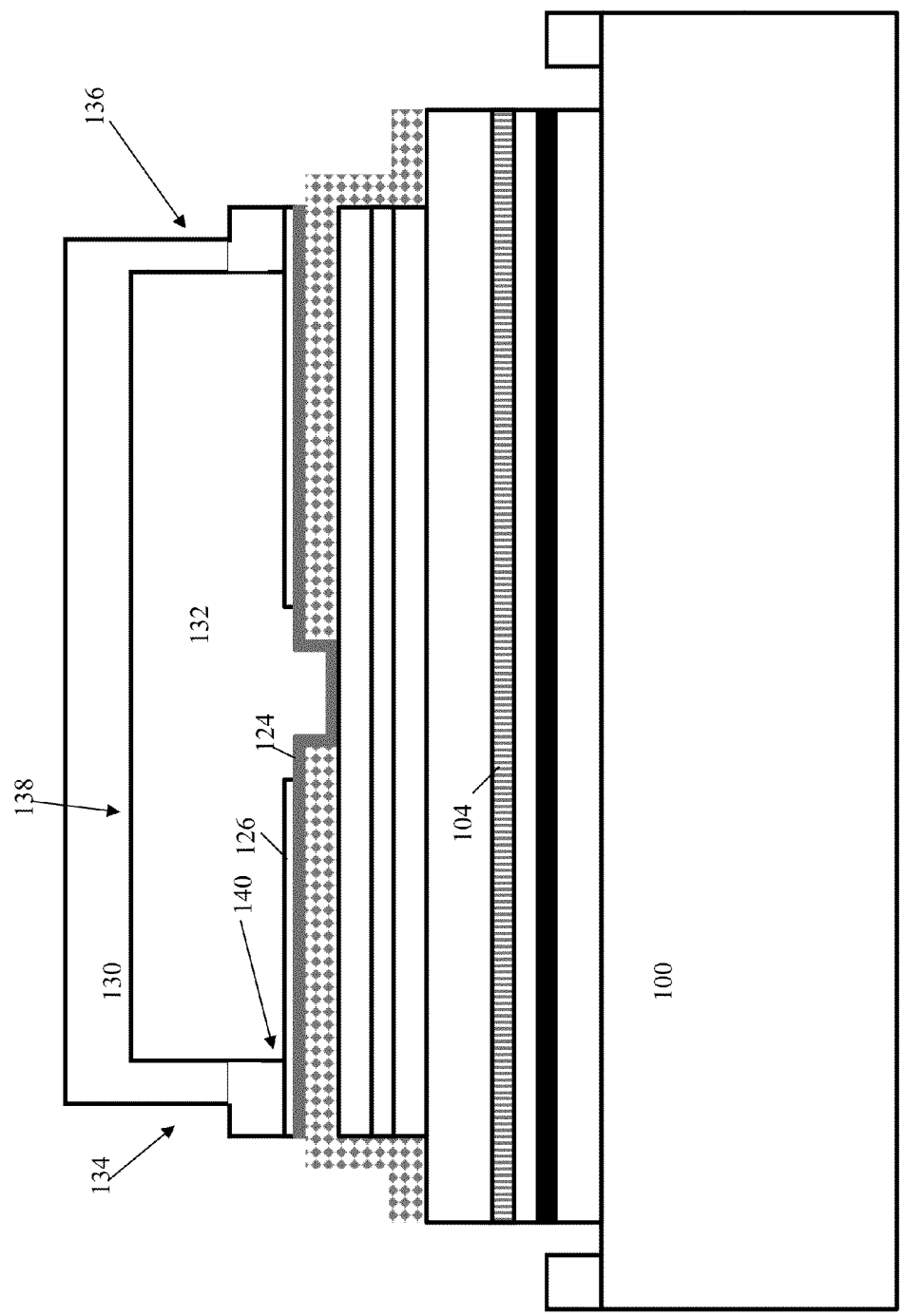
Figure 1I:
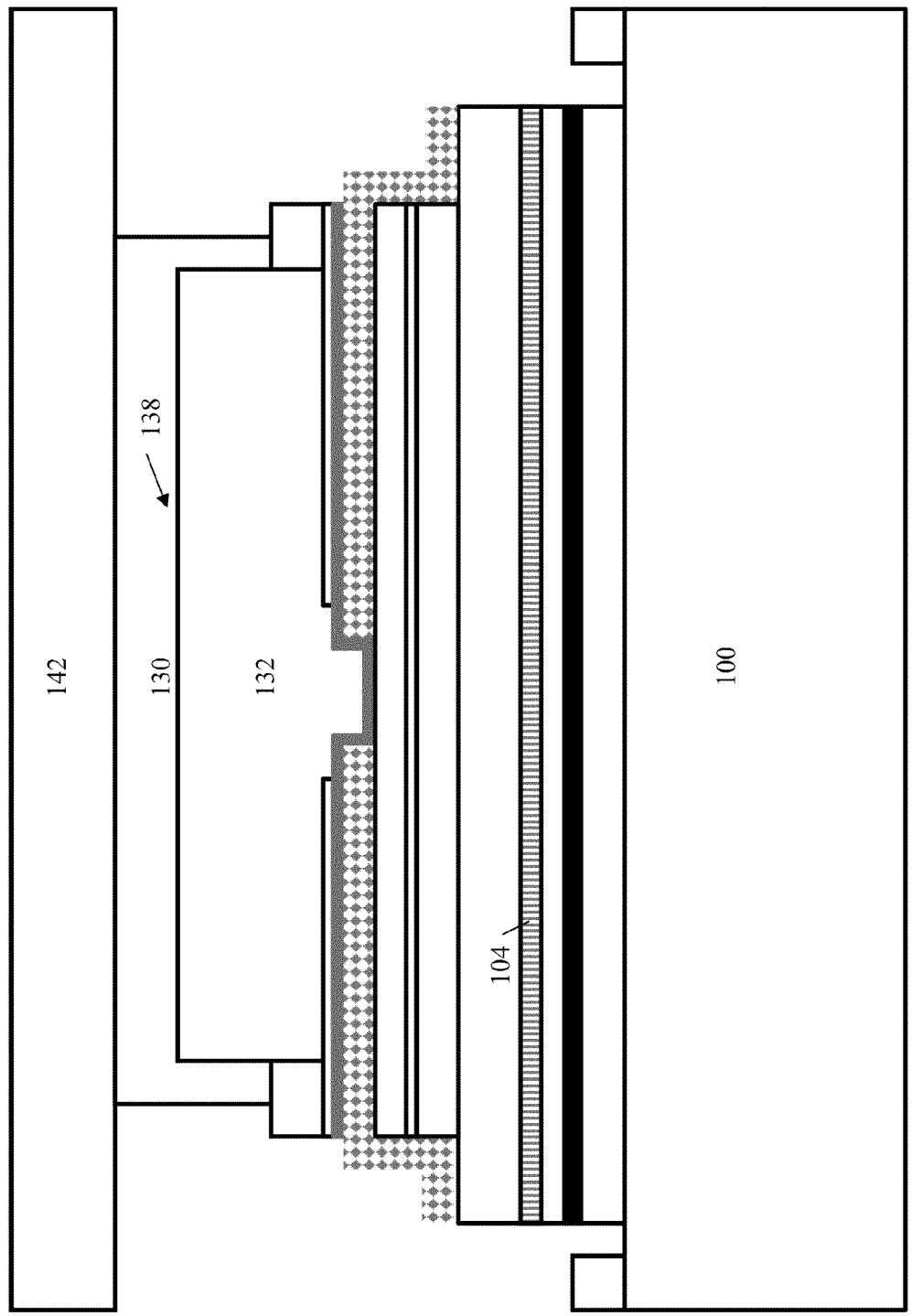
Figure 1J:
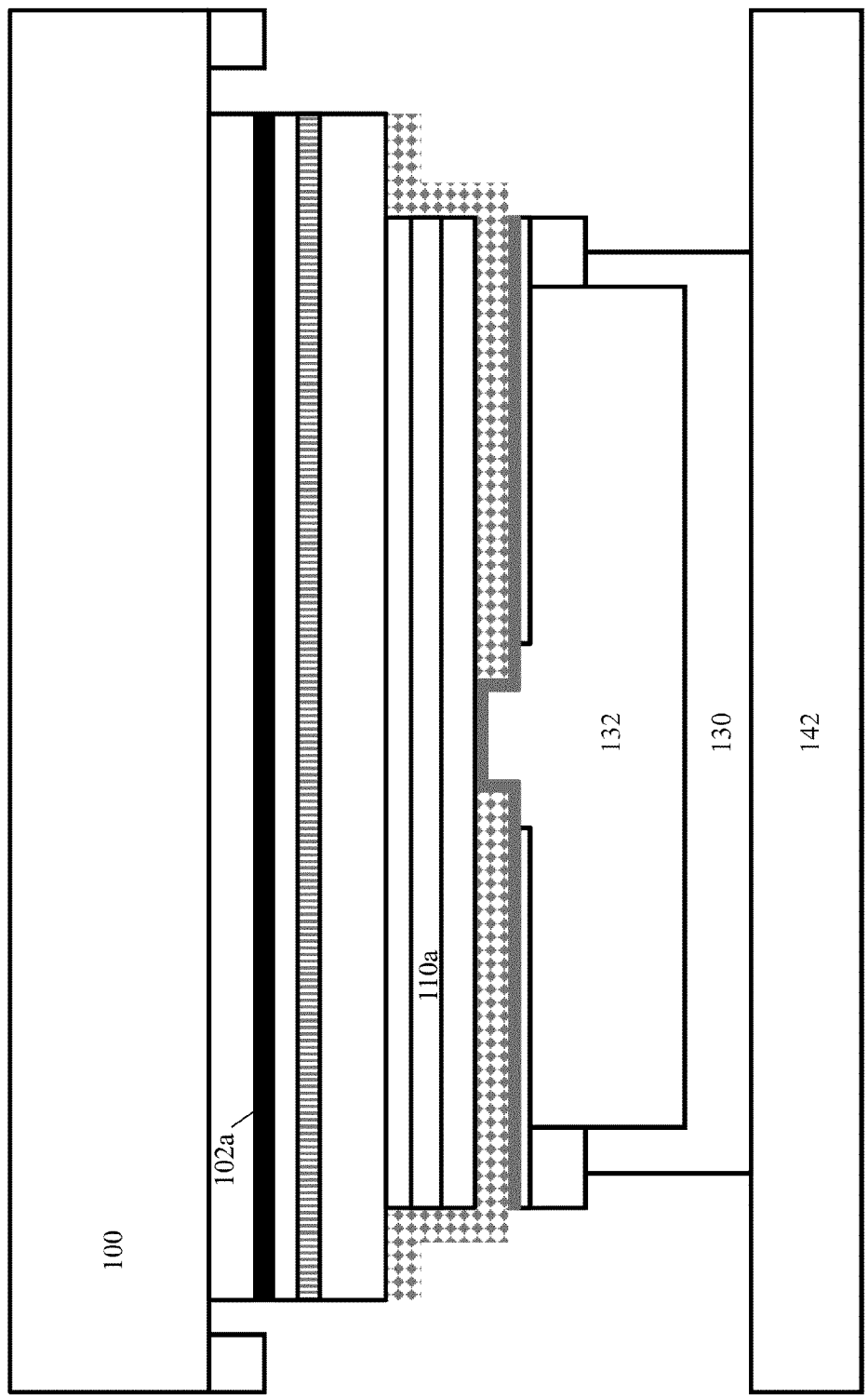
Figure 1K:
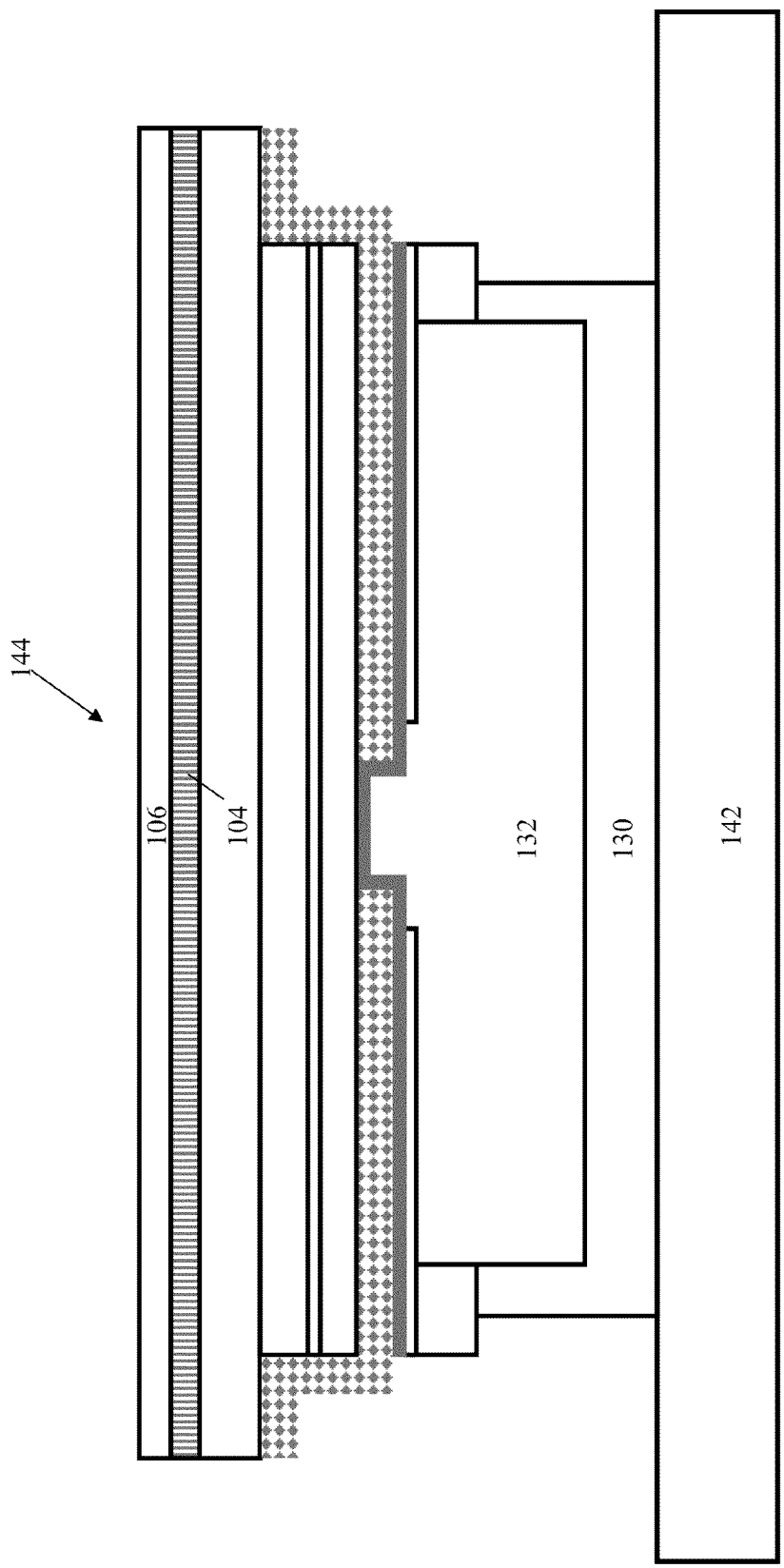
Figure 1L:
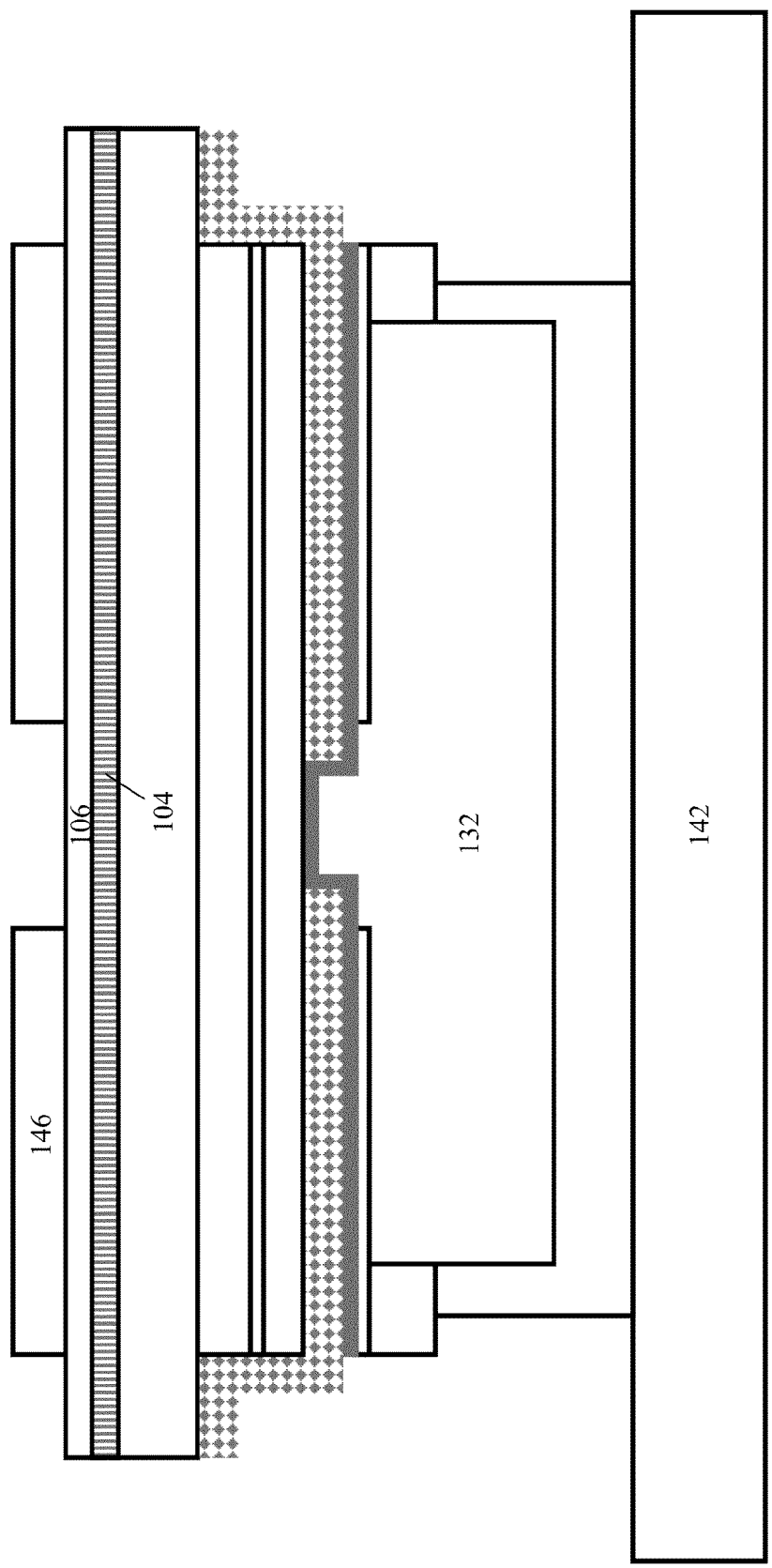
Figure 1M:
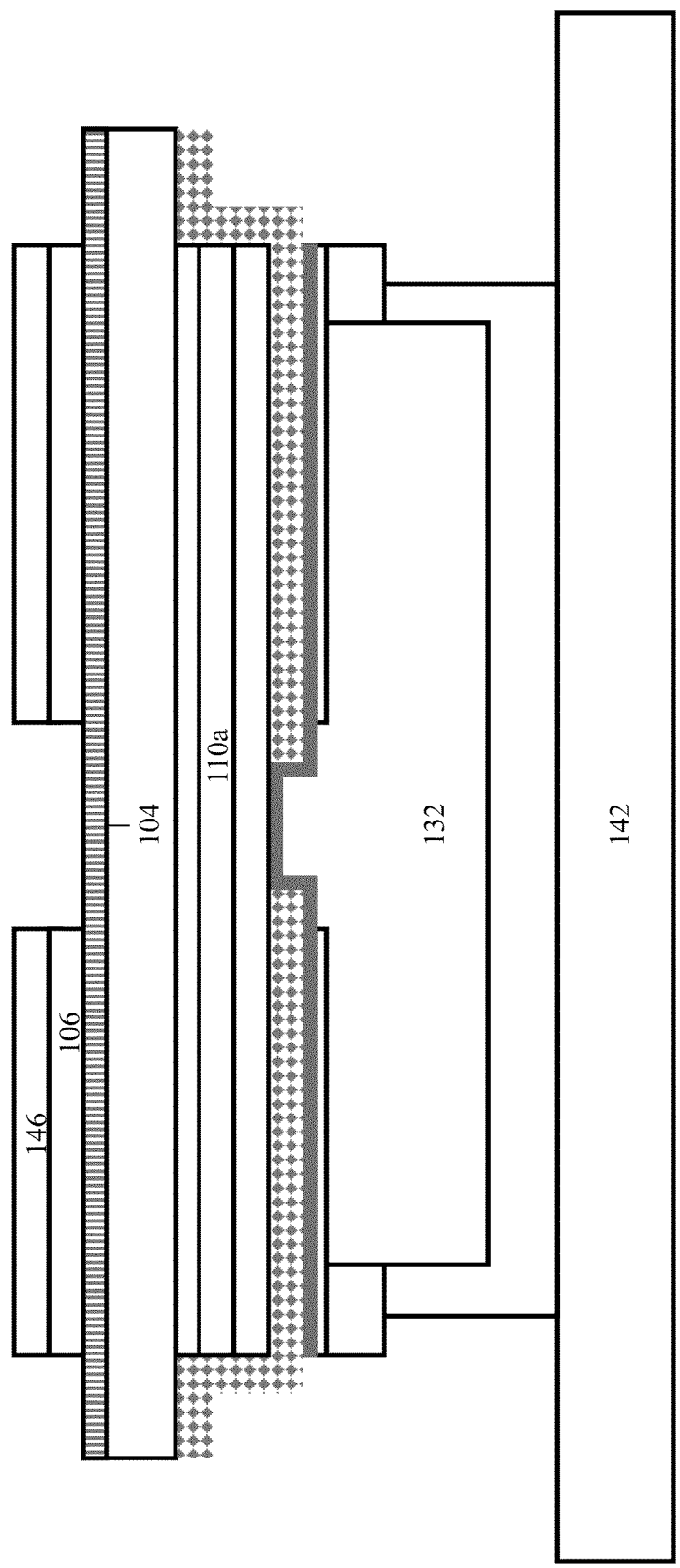
Figure 1N:
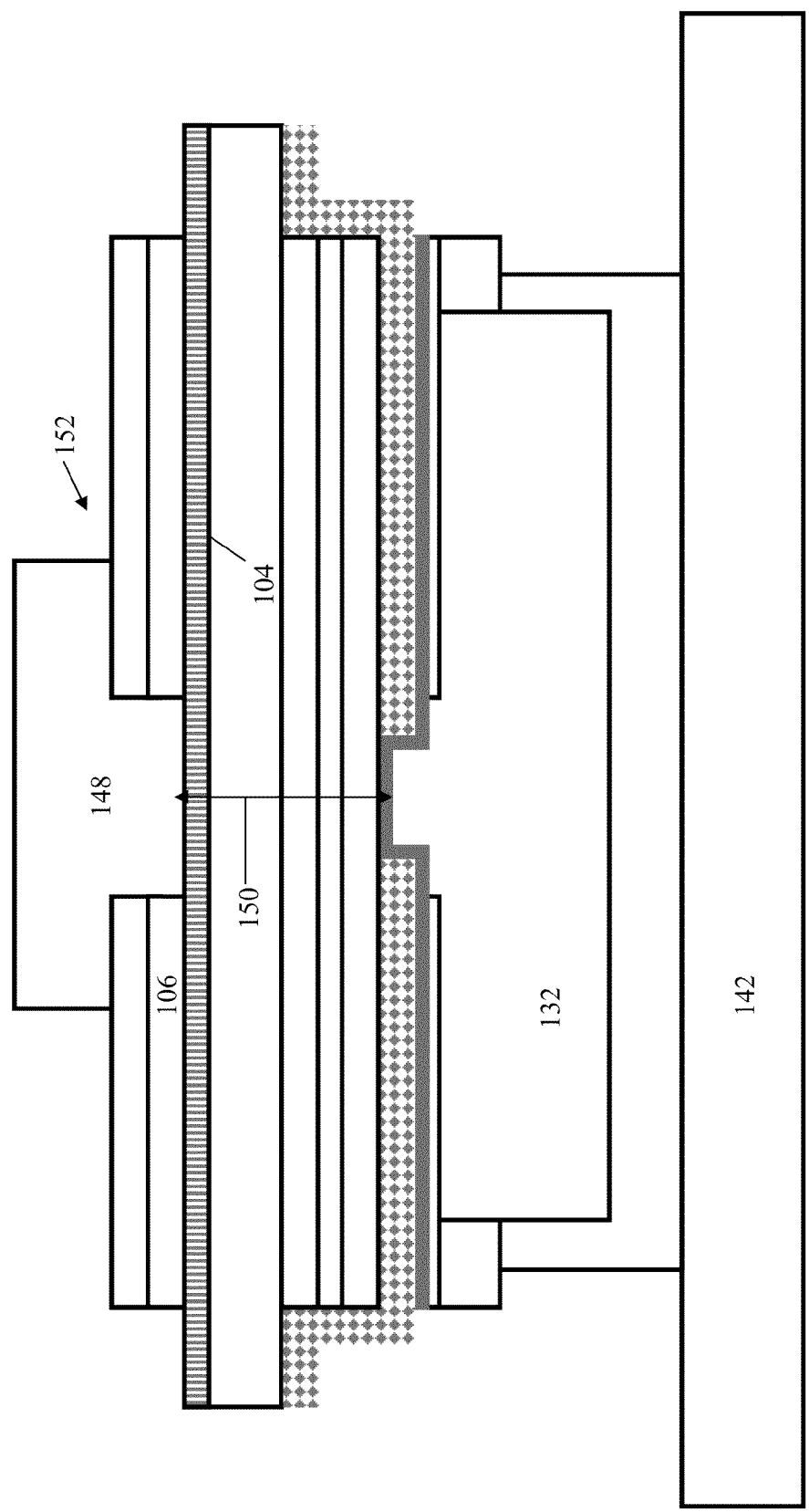
Figure 4A:
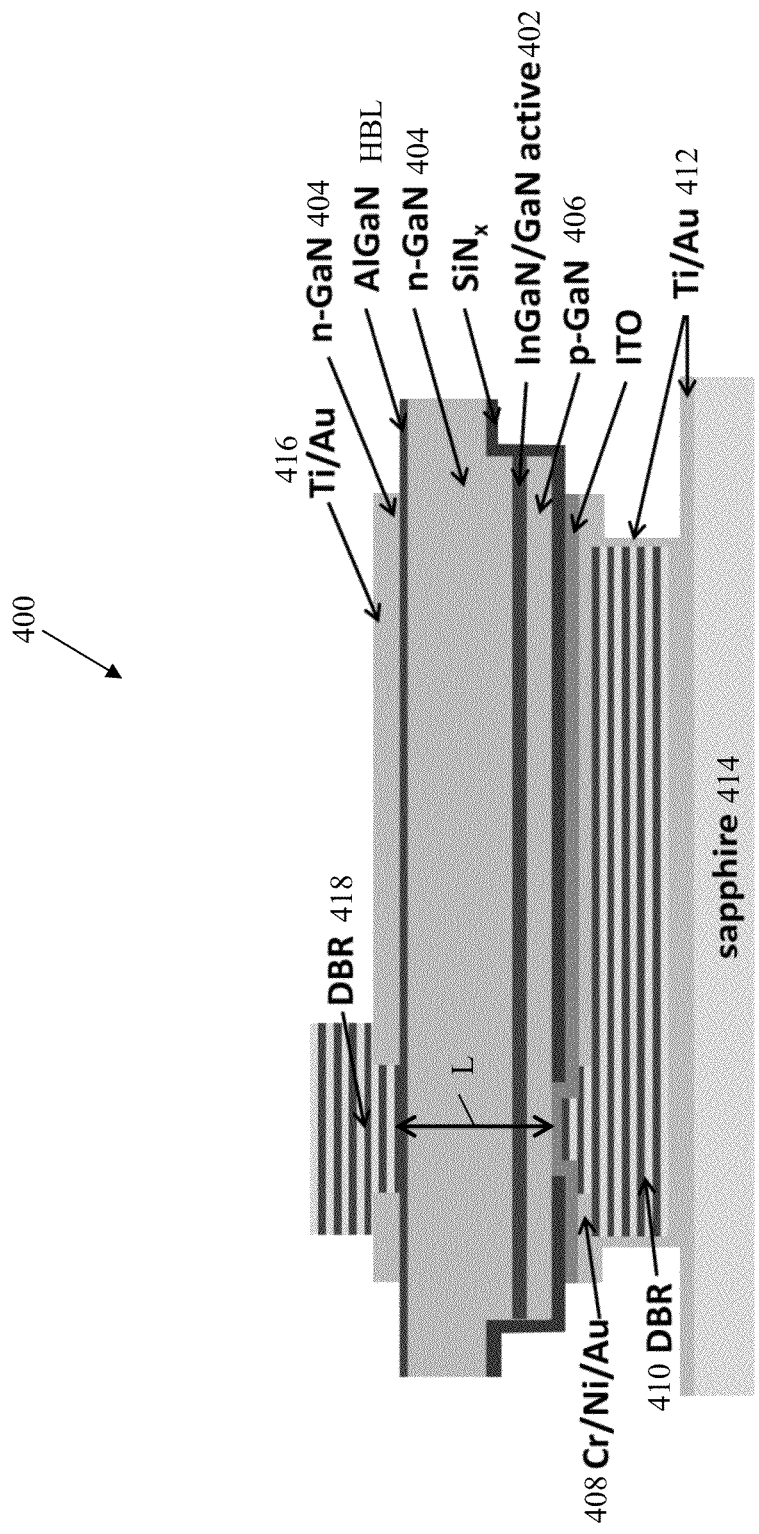
FIG. 4(a) illustrates a cross-sectional full device schematic of a working device.

Given here are also data showing the successful fabrication of an (Al,In,Ga)N laser diode fabricated using the process flow shown in FIG. 1(a)-(n), resulting in the device structure shown in FIG. 4(a).

FIG. 4(a) illustrates an embodiment of a device, comprising a non-polar or semi-polar III-nitride VCSEL 400 fabricated on a non-polar or semi-polar substrate (e.g. GaN or III-nitride substrate), wherein the substrate is at least partially removed. The VCSEL 400 can be a single-longitudinal-mode III-Nitride based nonpolar or semipolar VCSEL. The VCSEL can have a cavity length L of less than 3 microns.

The epitaxial structure for the device of FIG. 4 was grown on a free-standing m-plane GaN substrate (nominally offcut by 1° in the −c-direction) using atmospheric-pressure metalorganic chemical vapor deposition. The active region 402 comprises 5 $In_{0.1}Ga_{0.9}N$ quantum wells (each 7 nm thick) with GaN barriers (each 5 nm thick) and a 15 nm thick Mg-doped $Al_{0.2}Ga_{0.8}N$ electron blocking layer. A sacrificial InGaN region was embedded in the n-GaN 404 beneath the active region 402, consisting of 3 $In_{0.1}Ga_{0.9}N$ quantum wells (each 7 nm thick) separated by GaN barriers (each 5 nm thick). The placement of a 15 nm $Al_{0.3}Ga_{0.7}N$ hole-blocking layer HBL 50 nm above the sacrificial region serves to define the cavity length (~7λ, where λ is the wavelength of light emitted by the active region) and to prevent hole transport to the device sidewalls during the lateral undercut PEC etch [4] as described in FIG. 1(k). A mesa was defined by etching through the active region 402 (stopping above the sacrificial region, using the step illustrated in FIG. 1(b)) and a $SiN_x$ dielectric was patterned for protection of the active region 402 sidewalls during PEC etching and to define a current aperture, which ranges in diameter from 7 to 10 μm (as illustrated in FIG. 1(c)). Approximately 50 nm (λ/4-wave) of ITO was deposited and patterned as a p-type ohmic intra-cavity contact and current spreading layer, and contacting p-GaN 406 in the current aperture, as illustrated in FIG. 1(d). A metal ring contact 408 (Cr/Ni/Au) was formed around the current aperture (see FIG. 1(f)) before deposition of a λ/8-wave $Ta_2O_5$ interlayer to align the high-absorption ITO with a node of the optical standing wave and a 13-period $SiO_2/Ta_2O_5$ DBR) 410 (see FIG. 1(g)). A second mesa etch was performed to expose the sidewalls of the sacrificial undercut layer (as shown in FIG. 1(e)) and metal 412 (Ti/Au) was patterned to form a bonding pad and to electrically connect the metal ring contact 408 to the submount 414, as shown in FIG. 1(h). The sample was then bonded to a metal-coated sapphire submount 414 (see FIG. 1(i)) and the sacrificial InGaN layer was laterally etched by bandgap-selective PEC etching (as shown in FIG. 1(k)), using KOH and a 405 nm laser light source, until the substrate was removed. Ohmic ring n-contacts 416 (Ti/Au) were formed on the bonded mesas in alignment with the current apertures, as shown in FIG. 1(l) and a second bandgap-selective PEC etch was performed, with the $Al_{0.3}Ga_{0.7}N$ HBL acting as a highly-selective stop-etch layer, as shown in FIG. 1(m). Finally, a 10-period $SiO_2/Ta_2O_2$ DBR 418 was deposited, as shown in FIG. 1(n).

The end result is the VCSEL 400 comprising submount 414, Ti/Au metal 412, DBR 410, Cr/Ni/Au metal 408, ITO, $SiN_x$, p-GaN 406, active region 402, n-GaN 404, AlGaN HBL, Ti/Au metal 416, and DBR 418.

FIG. 4(b) shows a scanning electron microscope (SEM) image of three completed devices. FIG. 4(c) shows the near-field pattern of a 10-μm-diamater device operating above threshold.

FIG. 5 is the lasing spectrum of the device lasing at a wavelength of ~412 nm with a very narrow full-width half-max (FWHM). The lasing spectrum is obtained for the device operated above threshold at 100 mA with a duty cycle of 0.3% and at a temperature of 20° C. The lasing spectrum shows a full width at half maximum of 0.25 nm, an emission wavelength of ~412 nm, and that the device operates with a single longitudinal mode. Based on the device design, the total cavity length (including the effective penetration depth into the mirrors) is 1.47 μm. For this cavity length, the longitudinal mode spacing is approximately 15 nm and only one mode should exist within the gain bandwidth.

Thus, the present invention further discloses single-longitudinal-mode (Al,In,Ga)N VCSELs e.g., that utilize bandgap selective photoelectrochemical (PEC) etching of an epitaxially-grown sacrificial layer to achieve precise control of the cavity length down to small dimensions and guarantee single-longitudinal-mode operation.

FIG. 6 is a current vs. light (L-I) curve for the device showing a sharp turn-on threshold that is characteristic of a laser diode. FIG. 6 illustrates the VCSEL can emit light with an output power of no less than 19.5 microwatts μW or at least 19.5 microwatts, above threshold (e.g., at a drive current of no more than 120 milliamps).

Figure 7A:
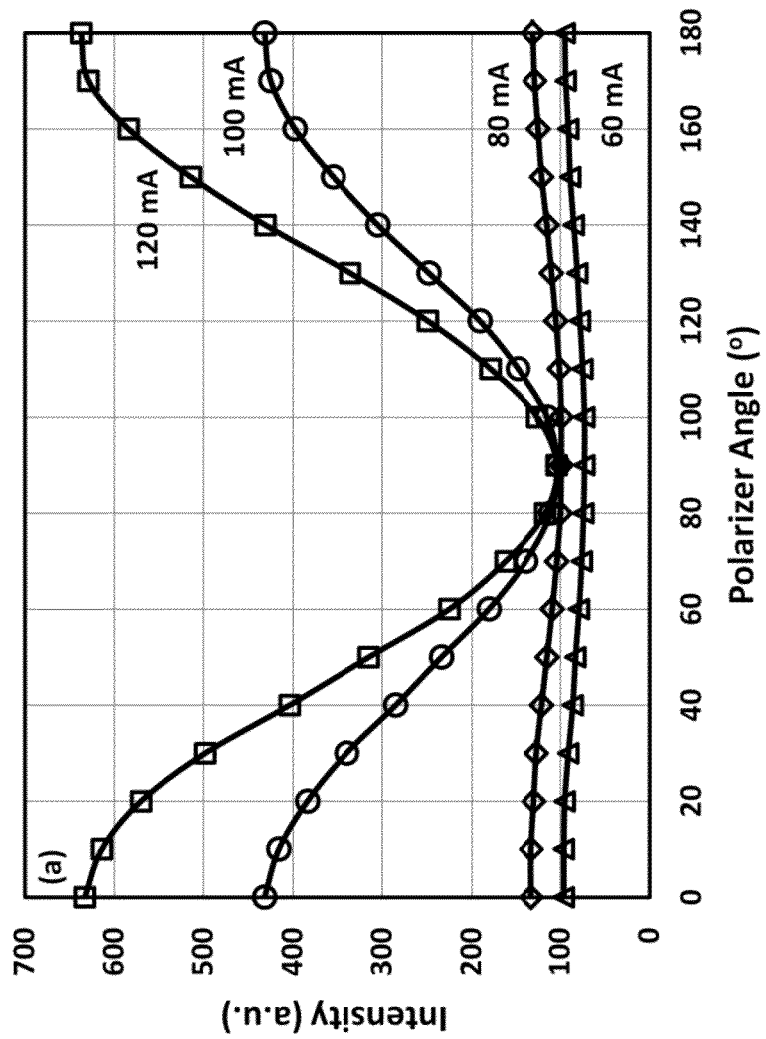
FIG. 7(a)-(b) illustrates polarization data, plotting output intensity (a.u.) vs. polarizer angle in degrees °, indicating lasing of a working device fabricated using the method of FIGS. 1(a)-(n), including polarization locking along the a-direction of the wurtzite crystal structure for the m-plane (Al,In,Ga)N VCSEL having the structure of FIG. 4(a).
Figure 7B:
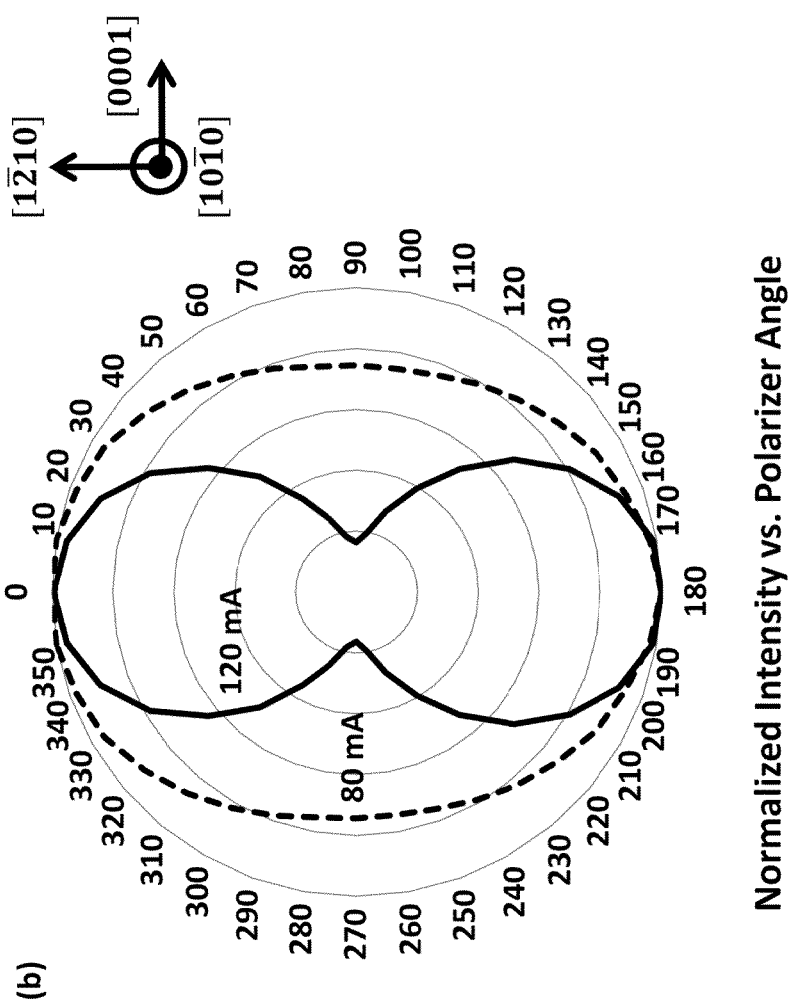

FIGS. 7 (a) and (b) demonstrate the polarization of light emitted by the devices: below threshold, the degree of polarization is low. Above threshold, once lasing begins, the laser is highly-polarized also indicating lasing. Because this is a nonpolar (Al,In,Ga)N device fabricated on the m-plane of the wurtzite crystal structure, the light polarizes in such a way that it is polarization-locked on the [1-210] a-direction of the wurtzite crystal structure for this III-nitride VCSEL structure. For both FIGS. 7(a) and 7(b), the polarizer angle was 0° when oriented along the [1-210] a-direction of the device. Thus, FIG. 7(a)-(b) illustrate the light emitted from the VCSEL is polarization locked (having its light polarization locked to a certain direction) effectively along the a-direction or perpendicular to the c-direction.

The polarization ratio is given by $(L_{max}-L_{min})/(L_{max}+L_{min})$, where $L_{max}$ and $L_{min}$ are the maximum and minimum relative light intensities, respectively. At currents of 60, 80, 100, and 120 mA, the polarization ratio is approximately 0.14, 0.15, 0.62, and 0.72, respectively. Well above the threshold current, the polarization ratio increases by approximately 5×.

FIG. 7(a) illustrates the VCSEL can emit light with a polarization ratio of no less than 0.72 or at least 0.72, above threshold (e.g., at a drive current of no more than 120 milliamps).

Multiple devices have been confirmed to show the same polarization-locking effect along the preferred crystal axis of the device. The non-polar and semi-polar (Al,In,Ga)N VCSELs afford highly directional and polarization locked operation of single devices and/or arrays of devices.

Arrays of VCSELs

Figure 8B:
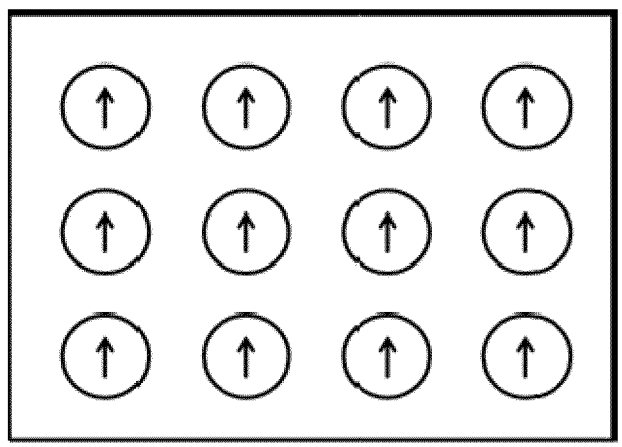
FIG. 8(b) illustrates an array of devices according to the present invention, with the polarization of the emitted light locked in the same direction by the innate structure of nonpolar and semipolar (Al,In,Ga)N VCSELs, according to one or more embodiments of the invention.
Figure 8A:
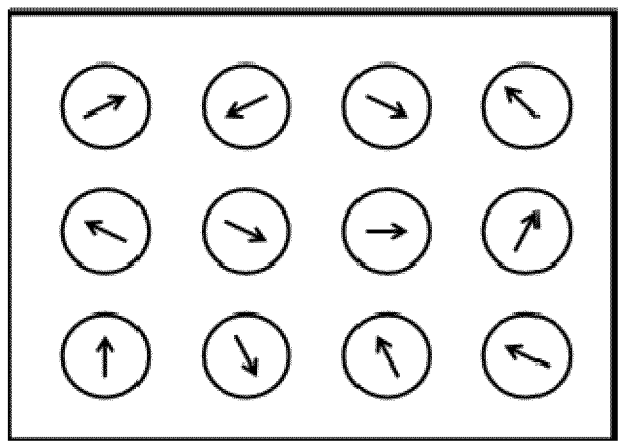
FIG. 8(a) shows an array of polar c-plane (Al,In,Ga)N VCSELs, with the polarization of any given device being random and wherein, since the polarization of individual devices is random, a polarization-locked array is impossible.

FIG. 8(a) illustrates polar c-plane VCSELs, and FIG. 8(b) illustrates nonpolar or semipolar VCSELs of the present invention, wherein in FIGS. 8(a) and 8(b) the circles represent individual VCSELs and the arrows indicate the direction of polarization of the electric field of the individual VCSELs.

FIGS. 8(a) and 8(b) illustrate the differences between polar c-plane VCSELs, and the nonpolar or semipolar VCSELs of the present invention.

The VCSELs of FIG. 8(a) exhibit random polarization. Conventional VCSELs can exhibit random polarization of the lasing mode due to their circularly symmetric cavities and isotropic gain properties. As a result, polarization control is difficult to achieve. Because no polarization-locked VCSELs have been demonstrated to-date, it has been impossible to achieve a polarization-locked VCSEL array, as all devices in the array would be polarized randomly with respect to one-another, as illustrated in FIG. 8(a).

The present invention solves these problems. Specifically, nonpolar and semipolar (Al,In,Ga)N materials allow for the fabrication of VCSELs with well controlled polarization. Due to the anisotropic gain characteristics of nonpolar and semipolar materials, the polarization of the lasing mode will lock along the direction of the highest gain. This direction will be well defined and the same for devices on a given plane. As a result, it is possible to fabricate single devices, or arrays of devices that all have the same direction of polarization (as illustrated in FIG. 8(b)). FIG. 8(b) illustrates a device comprising a nonpolar or semipolar VCSEL array with each VCSEL having its light polarization locked along a specific direction, e.g., effectively along a-direction or effectively perpendicular to c-direction. Polarization-locked arrays of VCSELs could provide high optical power with a well-defined polarization. This is particularly important for applications requiring stable polarization, such as liquid crystal on silicon (LCOS) displays, liquid crystal displays (LCDs), Liquid Crystal Light Valve (LCLV) displays, Micro-Electro-Mechanical Systems (MEMS) displays, data storage, printing, and biosensing.

Nonpolar or semipolar (Al,In,Ga)N VCSELs could be fabricated through any number of methods, but would be polarization-locked as an innate property of the devices.

Figure 9:
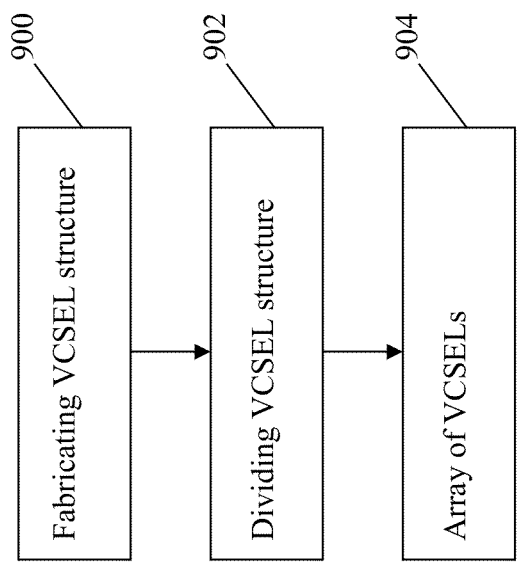
FIG. 9 is a flowchart illustrating a method of fabricating an array of VCSELs, according to one or more embodiments of the invention.

FIG. 9 illustrates a method of fabricating an array of nonpolar or semipolar VCSELs.

Block 900 represents the step of fabricating a nonpolar or semipolar VCSEL structure on a wafer, e.g., according to the method of FIGS. 1(a)-(n).

Block 902 represents dividing the VCSEL structure fabricated in Block 900 to fabricate a plurality of VCSELs, e.g., by dicing or etching to separate the VCSEL devices. Devices could be left on-wafer and diced into array of any arbitrary desired size, or could be singulated and then placed into an apparatus or application individually, with the light being combined externally.

Block 904 represents the end result, a novel device comprising an array of nonpolar or semipolar (Al,In,Ga)N VCSELs, or (Al,In,Ga)N VCSELs fabricated on a nonpolar or semipolar crystal orientation (including, but not limited to, m-plane, a-plane, 20-21, 20-2-1, 11-22), as illustrated in FIG. 8(b), with each VCSEL having its light polarization locked to a certain direction, e.g., all the VCSELs polarization-locked according to the crystal structure of the underlying substrate material or substrate upon which the VCSEL was grown. For example, for an array of nonpolar m-plane (Al,In,Ga)N VCSELs, the polarization is locked into the a-direction of the wurtzite crystal structure, perpendicular to the c-direction, and normal to the m-direction which is the direction of the propagation of the laser light. The nonpolar or semipolar VCSEL array can be used for all kinds of lighting applications with or without other lighting sources.

This polarization-locked array is due to the unique nature of non-polar and semi-polar (Al,In,Ga)N VCSELs and the process used which allows for the creation of a high-yield of these devices on one wafer.

Nonpolar or Semipolar VCSEL Lighting System

The nonpolar or semipolar III-nitride VCSEL of the present invention could be used as a high quality light source for a number of lighting applications, including directional lighting, light-bulbs, directional illumination, projectors, and displays.

Figure 10A:
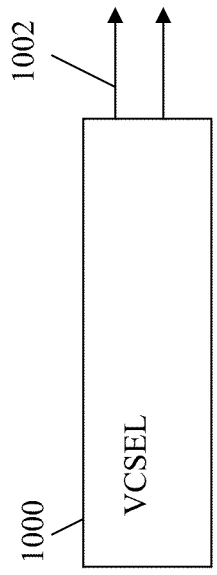
FIG. 10(a)-(c) illustrate a lighting system comprising a nonpolar or semipolar VCSEL as one or more light sources in the lighting system, according to one or more embodiments of the invention.

FIG. 10(a) illustrates a lighting system comprising a nonpolar or semipolar (e.g., III-nitride) laser or VCSEL as one of the light sources 1000 emitting light 1002. The light source 1000 can comprise a single VCSEL or a plurality of VCSELs (e.g., an array of nonpolar and/or semipolar VCSELs). The VCSELs or lasers can emit violet light, for example. A highly directional and polarized emission from the nonpolar and semipolar VCSEL can be used in the lighting systems.

Figure 10B:
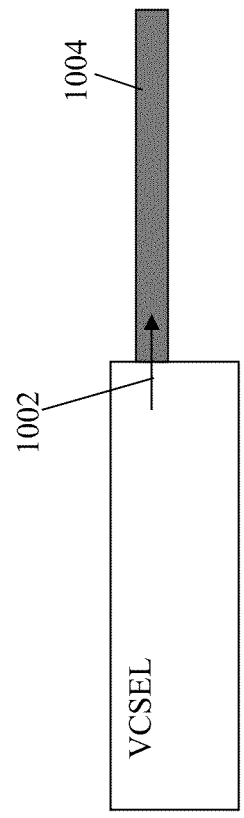

FIG. 10(b) illustrates a lighting system in which the nonpolar or semipolar VCSEL is coupled into a light guiding material 1004. The nonpolar or semipolar VCSEL can be coupled into a fiber optic, such that light 1002 emitted by the VCSEL is coupled into the fiber optic 1004.

Figure 10C:
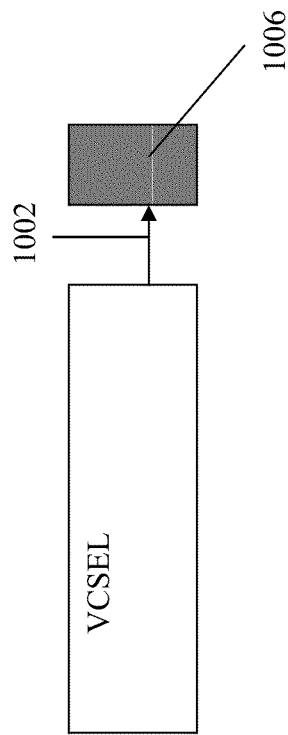

FIG. 10(c) illustrates a lighting system in which a nonpolar or semipolar VCSEL is pumping a down-converting media 1006, medium, or material with light 1002 emitted from the VCSEL. The down-converting material 1006 can be composed of a phosphor, organic dye, organic LED, polymer, single crystal, garnet compound, semiconductor, or quantum dot, for example. The nonpolar or semipolar VCSEL can be used to pump a remotely placed down-conversion media, medium, or material 1006, or the nonpolar or semipolar VCSEL can be used to pump a down-conversion media 1006 in contact with the device, VCSEL, or lighting apparatus. The nonpolar or semipolar VCSEL emission can be collimated or focused onto the down-conversion media 1006. The nonpolar or semipolar VCSEL emission can be partially or fully down-converted.

VCSEL Based Display System

FIG. 11(a) illustrates a device comprising a display system 1100 using, or in combination with, one or more nonpolar or semipolar VCSELs as one of the light sources 1000. The display system 1100 can use an array of the nonpolar or semipolar VCSELs as the light source 1000. The display system 1100 comprises the VCSEL coupled to a display 1102, wherein the light 1104 emitted from the VCSEL is coupled into the display 1102 to provide lighting or back lighting for the display 1102. The VCSELs can comprise (Al,In,Ga)N VCSELs fabricated on a non-polar or semi-polar crystal orientation (including, but not limited to, m-plane, a-plane, (20-21), (20-2-1), (11-22)).

As discussed above, non-polar and semi-polar (Al,In,Ga)N VCSELs afford polarization locked operation of single devices and/or arrays of devices. The one or more nonpolar or semipolar VCSELs in the display system can have their light polarization locked to a certain direction, e.g., the VCSELs can be all polarization-locked according to the crystal structure of the underlying substrate material, the nonpolar or semipolar VCSEL can have its light polarization locked effectively along an a-direction, or effectively perpendicular to a c-direction. For example, m-plane non-polar and tilted m-plane semipolar planes (such as (20-21) and (20-2-1)) will polarize preferentially along the crystallographic a-direction (perpendicular to the c-direction). This polarization allows for the use of non-polar and semi-polar (Al,In,Ga)N VCSELs in applications requiring polarized light, including display, lighting, projectors, and projection systems/technologies such as LCOS, LCD, LCLV and MEMS display systems. Thus, the display 1102 or display system 1100 can comprise a liquid crystal on silicon (LCOS), liquid crystal display (LCD), Liquid Crystal Light Valve (LCLV), or Micro-Electro-Mechanical Systems (MEMS) display system.

The polarized emission from nonpolar and semipolar lasers of the present invention can be of particular use in display systems, since polarized emission will result in higher efficiency of light transmission through the display system and therefore higher system efficiency.

The nonpolar or semipolar VCSELs in the display can optically pump down-converting material, as described in the section entitled "Nonpolar or Semipolar VCSEL Lighting System". For example, the nonpolar or semipolar VCSEL light source can be in combination with a phosphor and pump the phosphor. Thus, the nonpolar or semipolar VCSEL can be used as the pump light source of a phosphor in the display 1102 or lighting system.

FIG. 11(*b*) illustrates the nonpolar or semipolar VCSEL light source 1000 in the display system 1100 in combination with an LED light source. For example, the VCSEL can be in combination with at least a red LED emitting red light 1106 and at least one phosphor 1108, wherein the VCSEL is a blue laser, emitting blue light 1110, and the VCSEL pumps the phosphor 1108 such that the phosphor 1108 emits green light 1112 in response to the blue light 1110, and the display 1102 receives red 1106, blue 1110, and green light 1112.

The nonpolar or semipolar VCSEL light source 1000 can be a red, green, or blue light source. When the VCSEL is a red, green, or blue light source, the phosphor can emit yellow or green light.

White Light Source

Figure 12:
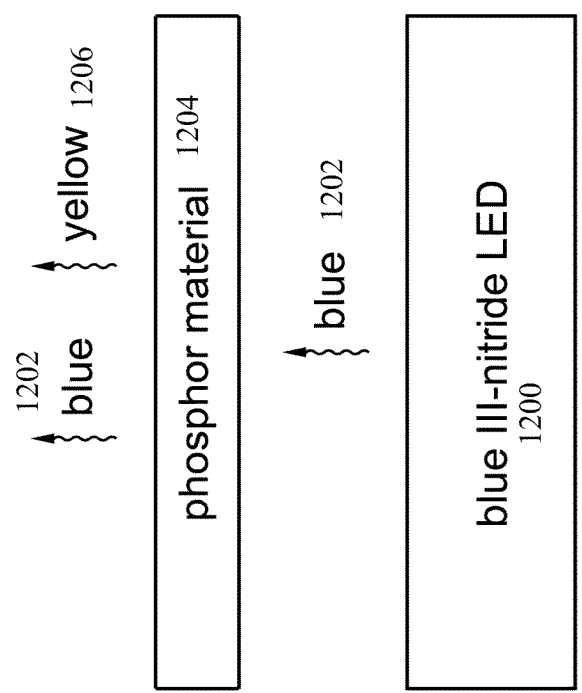
FIG. 12 illustrates a lighting system using a blue light emitting diode.

FIG. 12 illustrates a conventional solid-state lighting system using a III-nitride LED 1200 that emits blue light 1202 to excite a phosphor 1204, typically Ce-doped YAG, that emits yellow light 1206 [5]. Some of the blue light 1202 from the LED 1200 is transmitted through the phosphor 1204 and is combined with the yellow light 1206 from the phosphor 1204 to create a dichromatic white light source. However, this configuration for a solid-state lighting system typically has a low Color Rendering Index (CRI) and a high correlated color Temperature (CCT), and produces white light with a spectrum that differs considerably from the spectrum of natural sunlight [6].

As an alternative to the dichromatic white light source discussed above, a violet III-nitride LED can be used to excite two or more phosphors with different emission spectra to create a high-quality white light source with a high CRI and low CCT [5]. In such a lighting system, the light emitted from the violet III-nitride LED may or may not be combined with the light emitted from the phosphors to create a high-quality white light source. However, the light emitted by an LED is spatially and temporally incoherent, meaning that some fraction of the light emitted by the LED is always going to be lost due to absorption at the backside of the LED, absorption at metal contacts at the top side of the LED, or potentially misdirected emission from the sidewalls of the LED.

Thus, there is a need in the art for improved white light-emitting devices for use in solid-state lighting systems. The present invention satisfies this need.

This invention uses a violet III-nitride nonpolar or semipolar VCSEL to excite two or more phosphors with different emission spectra to create an energy efficient solid-state lighting system that produces high-quality white light. A VCSEL is a type of semiconductor laser where the laser beam emission is perpendicular to the surface of the wafer, much like an LED. The advantage of using a VCSEL instead of an LED is that the light emitted by a VCSEL is spatially and temporally coherent, so both the directionality and efficiency of the light extraction can be precisely controlled through the design of the optical cavity.

Although the spatial and temporal coherence of light emission from a VCSEL can be useful for controlling light extraction, highly coherent light emission can also be harmful to human vision. Thus, for some applications, the highly coherent emission from a VCSEL may preclude replacing the blue LED 1200 in FIG. 12 with a blue VCSEL emitting blue light, so that the blue light 1202 emitted from the blue III-nitride VCSEL combined with yellow light 1206 emitted from a phosphor 1204 creates a dichromatic white light source (in other words, for some applications, a blue III-nitride VCSEL may not be used as a light emitter in the solid-state lighting system configuration shown in FIG. 12). To be safe for human vision, and in some applications, the coherent light emitted by a III-nitride VCSEL would need to be completely absorbed by the phosphor materials.

Therefore, to make a safe, high-quality white light source that incorporates a III-nitride VCSEL, the present invention discloses a III-nitride VCSEL emitting violet light exciting two or more phosphors with different emission spectra for a high CRI and low CCT. The violet light can be completely absorbed by the phosphor materials.

Figure 13:
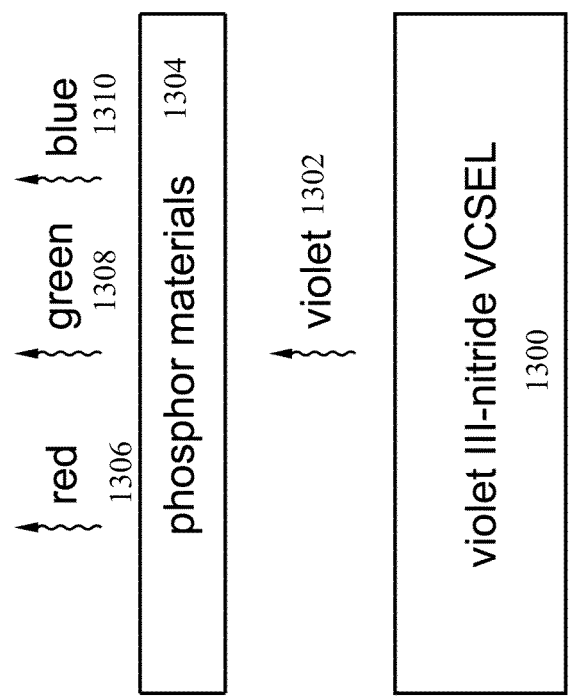
FIG. 13 illustrates a lighting system, comprising one or more III-nitride nonpolar or semipolar VCSELs emitting violet light that excites two or more phosphors with different emission spectra to produce white light, according to one or more embodiments of the invention.

This type of configuration for a solid-state lighting system is illustrated by the schematic in FIG. 13, which illustrates a lighting system, comprising: one or more III-nitride nonpolar or semipolar VCSELs 1300 emitting violet light 1302 (e.g., with an emission wavelength between about 380 nm and 430 nm) that excites two or more phosphors 1304 with different emission spectra to produce white light, e.g., with a CRI greater than 90 or about 90 and/or a CCT less than 3000K or about 3000 K. The violet light emitted by the III-nitride nonpolar or semipolar VCSELs can be substantially completely absorbed by the phosphors. The phosphors can emit red 1306, green 1308, and blue 1310 light when excited by the violet light 1302, wherein the combination of red 1306, green 1308, and blue 1310 light appears as the white light. Although three phosphors 1304 emitting red 1306, green 1308, and blue 1310 light are shown in the schematic for the purpose of illustration, any number of two or more phosphors could be used to create an energy efficient high-quality white light source. The III-nitride nonpolar or semipolar lasers in the white light source can be arranged in an array.

Similar advantages in terms of directionality and efficiency for light extraction could also be obtained with an edge-emitting laser (EEL), since the light emitted by an EEL is also spatially and temporally coherent. An EEL is a type of semiconductor laser where the laser beam emission is parallel to the surface of the wafer and the mirrors of the laser that define the optical cavity are formed by cleaving the wafer along crystallographic planes that are perpendicular to the surface of the wafer. Although both types of lasers emit spatially and temporally coherent light, VCSELs have a number of advantages related to manufacturing compared to EELs. EELs cannot be tested until the very end of the device fabrication when the wafer is cleaved to form the optical cavity. If the EEL does not function properly due to poor material quality or a processing problem, the entire fabrication time and all of the processing materials will have been wasted. In contrast, VCSELs can be tested at several stages throughout the fabrication to check for material quality and processing issues. In addition, since the light emission from VCSELs is perpendicular to the surface of the wafer, tens of thousands of devices can be formed on a single wafer and large numbers of devices can even be connected in parallel to form ultrahigh power density arrays [7]. These sorts of arrays could be used in a solid-state lighting system to form ultrahigh power density light white light emitters.

Possible Modifications

As discussed above, VCSEL devices can also be fabricated on semi-polar substrate orientations such as, but not limited to, 20-21 orientations.

VCSEL device performance can be further improved, including improved threshold current density, improved power output, improved device yield. The VCSELs can operate at a wide range of wavelengths (such as blue and green).

Advantages and Improvements

The present invention has fabricated and demonstrated working, electrically-injected (Al,In,Ga)N VCSELs which lase at room temperature.

The present invention's method allows for the fabrication of (Al,In,Ga)N VCSELs that provide better yield and performance ratios vs. cost than VCSELs fabricated using other methods.

The present invention's structure/method can demonstrate/fabricate (Al,In,Ga)N VCSELs with improved or enhanced device performance over VCSELs (including other (Al,In,Ga)N VCSELs) fabricated using other methods or over polar/c-plane oriented VCSELs. For example, the present invention can be used to fabricate single-longitudinal-mode (Al,In,Ga)N VCSELs, which are difficult to realize with other fabrication techniques which have only achieved multi-longitudinal mode operation [1]. The present method allows for extremely precise control of cavity length (a prerequisite for a high yield of single-mode VCSELs), as the cavity length is entirely controlled by epitaxial growth, and it allows for this precise control while still allowing for the use of cheaper/easier dielectric DBR mirrors (as opposed to epitaxially-grown DBRs, which are significantly more difficult to produce). Thus, the present invention's method provides very precise cavity control in the production of a (Al,In,Ga)N in a way that is much easier than any other method that can provide a similar level of cavity length control.

Non-polar and semi-polar III-nitride or (Al,In,Ga)N VCSELs have inherent advantages for many applications. Due to the anisotropic gain in the quantum wells, such devices display a well-defined and consistent polarization, allowing for polarization locked operation of single devices and/or arrays of devices. For example, m-plane non-polar and tilted (e.g., slightly-tilted) m-plane semipolar planes (such as (20-21) and (20-2-1)) will polarize preferentially along the crystallographic a-direction (perpendicular to the c-direction).

As a result, nonpolar and semipolar (Al,In,Ga)N VCSELs demonstrate inherent advantages and improved device performance over c-plane and polar-oriented (Al,In,Ga)N VCSELs, particularly in applications requiring polarized light, such as LCD and LCOS displays, as nonpolar and semipolar devices are polarization-locked according to the crystal orientation/structure of the semiconductor wafer/device and polar c-plane oriented devices are randomly polarized. Improved gain on nonpolar and semipolar orientations (e.g., higher gain than polar/c-plane orientations for (Al,In,Ga)N devices) can also lead to enhanced/better device performance in other metrics and/or in all applications (not just those requiring polarized light), such as optical data storage and high-resolution printing. The enhanced optical characteristics of non-polar and semi-polar (Al,In,Ga)N VCSELs could also be used in specialty applications such as biosensing.

For applications requiring high-quality polarized light in powers higher than what is available for a single VCSEL, polarization-locked VCSEL arrays could be an attractive option, due to the high quality of the polarization present and the higher powers available from arrays of arbitrary size. Specifically, because of the nature of the VCSEL polarization, whereby the light output from the VCSEL is polarized according to the crystal structure of the devices, all devices will polarize identically. This is in contrast to polar/c-plane oriented (Al,In,Ga)N VCSELs, which polarize randomly. This identical polarization among all devices allows device arrays of arbitrary size to be constructed where all devices are identically polarizing, greatly expanding the number of applications for which these devices can be used. Because polar/c-plane oriented devices polarize randomly, applications which require polarized light are limited to single devices or arrays, which then use a polarizing filter to polarize the output light, thereby limiting the power and/or efficiency available from such light sources. However, because of the polarization-locked nature of non-polar/semi-polar (Al,In,Ga)N device arrays, many devices can be arrayed to yield additional optical power for applications requiring a high intensity of highly-polarized light.

These advantages will also result in lighting systems with higher system efficiencies.

Nomenclature

The terms (Al,In,Ga)N or "Group-III nitride" or "III-nitride" or "nitride" as used herein refer to any composition or material related to (Al, In, Ga)N semiconductors having the formula $Al_xIn_yGa_zN$ where $0 \le x \le 1$, $0 \le y \le 1$, $0 \le z \le 1$, and $x+y+z=1$. These terms as used herein are intended to be broadly construed to include respective nitrides of the single species, Al, In, and Ga, as well as binary, ternary and quaternary compositions of such Group III metal species. Accordingly, these terms include, but are not limited to, the compounds of AlN, GaN, InN, AlGaN, AlInN, InGaN, and AlGaInN. When two or more of the (Al, In, Ga)N component species are present, all possible compositions, including stoichiometric proportions as well as off-stoichiometric proportions (with respect to the relative mole fractions present of each of the (Al, In, Ga)N component species that are present in the composition), can be employed within the broad scope of this invention. Further, compositions and materials within the scope of the invention may further include quantities of dopants and/or other impurity materials and/or other inclusional materials.

Similarly, Group III-nitride or III-nitride can also refer to (Al,In,Ga,B)N semiconductors having the formula $Al_xIn_yGa_zB_wN$ where B is Boron and $0 \le x \le 1$, $0 \le y \le 1$, $0 \le z \le 1$, $0 \le w \le 1$ and $w+x+y+z=1$.

This invention also covers the selection of particular crystal orientations, directions, terminations and polarities of Group-III nitrides. When identifying crystal orientations, directions, terminations and polarities using Miller indices, the use of braces, { }, denotes a set of symmetry-equivalent planes, which are represented by the use of parentheses, ( ). The use of brackets, [ ], denotes a direction, while the use of brackets, < >, denotes a set of symmetry-equivalent directions.

Many Group-III nitride devices are grown along a polar orientation, namely a c-plane {0001} of the crystal, although this results in an undesirable quantum-confined Stark effect (QCSE), due to the existence of strong piezoelectric and spontaneous polarizations. One approach to decreasing polarization effects in Group-III nitride devices is to grow the devices along nonpolar or semipolar orientations of the crystal.

The term "nonpolar" includes the {11-20} planes, known collectively as a-planes, and the {10-10} planes, known collectively as m-planes. Such planes contain equal numbers of Group-III and Nitrogen atoms per plane and are charge-neutral. Subsequent nonpolar layers are equivalent to one another, so the bulk crystal will not be polarized along the growth direction.

The term "semipolar" can be used to refer to any plane that cannot be classified as c-plane, a-plane, or m-plane. In crystallographic terms, a semipolar plane would be any plane that has at least two nonzero h, i, or k Miller indices and a nonzero 1 Miller index. Subsequent semipolar layers are equivalent to one another, so the crystal will have reduced polarization along the growth direction.

REFERENCES

The following references are incorporated by reference herein.

[1] K. Omae, et al., "Improvement in Lasing Characteristics of GaN-based Vertical-Cavity Surface-Emitting Lasers Using a GaN Substrate", *Appl. Phys. Express* 2 052101 (2009).

[2] O. Imafuji, et al., "Continuous Wave Operation of GaN Vertical Cavity Surface Emitting Lasers at Room Temperature", J. Quant. Elec. 48 1107 (2012).

[3] T-C Lu, et al., "CW lasing of current injection blue GaN-based vertical-cavity surface emitting laser", *Appl. Phys. Lett* 92, 141102 (2008).

[4] A. C. Tamboli, M. C. Schmidt, A. Hirai, S. P. DenBaars, and E. L. Hu, "Photoelectrochemical Undercut Etching of m-Plane GaN for Microdisk Applications," Journal of The Electrochemical Society, vol. 156, no. 10, p. H767, 2009.

[5] M. R. Krames, O. B. Shchekin, R. Mueller-Mach, G. O. Mueller, L. Zhou, G. Harbers, and M. G. Craford, J. Disp. Technol. 3, 160 (2007).

[6] E. F. Schubert, Light-Emitting Diodes, 2nd ed. (Cambridge University Press, Cambridge, 2006).

[7] J. F. Seurin, C. L. Ghosh, V. Khalfin, A. Miglo, X. Guoyang, J. Wynn, P. Pradhan, and L. Arthur D'Asaro, Proc. SPIE 6908, 690808 (2008).

[8] Casey Holder et. al., Demonstration of Nonpolar GaN-Based Vertical-Cavity Surface-Emitting Lasers, Appl. Phys. Express 5 (2012) 092104.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A III-Nitride based Vertical Cavity Surface Emitting Laser (VCSEL), comprising a cavity length controlled by etching, wherein an Aluminum (Al) containing layer in the VCSEL's epitaxial structure is used as an etch stop layer for the etching.

2. The VCSEL of claim 1, wherein the etching is carried out by photoelectrochemical etching.

3. The VCSEL of claim 1, wherein an Indium (In) containing layer in the VCSEL's epitaxial structure is used as a sacrificial layer for the VCSEL's substrate removal by the etching.

4. The VCSEL of claim 3, wherein the etching is carried out by photoelectrochemical etching.

5. The VCSEL of claim 1, wherein the VCSEL is a nonpolar III-nitride VCSEL.

6. The VCSEL of claim 1, wherein the VCSEL is grown on a nonpolar or semipolar substrate.

7. The VCSEL of claim 1, wherein a longitudinal mode of the VCSEL is a single mode.

8. The VCSEL of claim 1, wherein the cavity length is controlled after at least partially removing a substrate on which the VCSEL is grown.

9. The VCSEL of claim 1, wherein the VCSEL is a semipolar III-nitride VCSEL.

10. The VCSEL of claim 1, wherein the VCSEL is grown on a semipolar gallium nitride substrate.

11. The VCSEL of claim 1, wherein the VCSEL is grown on a nonpolar gallium nitride substrate.

12. A method of fabricating a III-nitride based Vertical Cavity Surface Emitting Laser (VCSEL), comprising
providing or fabricating a III-nitride VCSEL structure grown on a III-nitride substrate, the III-nitride VCSEL, structure comprising an etch stop layer below an active region;
fabrication a first cavity mirror for the VCSEL on a first side of the VCSEL structure;
attaching the VCSEL structure, at the first cavity mirror, to a submount;
etching down to the etch stop layer to control or define a cavity length of the VCSEL; and
fabricating a second cavity mirror for the VCSEL on the second side of the VCSEL, wherein the first cavity mirror and the second cavity mirror define the VCSEL's laser cavity having the cavity length.

13. The method of claim 12, wherein:
the VCSEL structure comprises one or more sacrificial layers containing indium below the active region,
the method further comprises laterally photoelectrochemically etching the sacrificial layers, and
the etch stop layer comprises aluminum.

14. The method of claim 12, wherein the controlling or defining the cavity length of the VCSEL by etching is after at least partially removing the III-nitride substrate on which the VCSEL is grown.

15. The method of claim 12, wherein the III-nitride VCSEL structure is a semipolar III-nitride VCSEL structure grown on a semipolar surface of the III-nitride substrate.

16. The method of claim 12, wherein the III-nitride VCSEL structure is a nonpolar III-nitride VCSEL structure grown on a nonpolar surface of the III-nitride substrate.

17. The method of claim 12, wherein the cavity length is such that the III-nitride VCSEL has single longitudinal mode operation.

18. A method of fabricating a III-nitride based Vertical Cavity Surface Emitting Laser (VCSEL), comprising:
obtaining or growing epitaxial layers on a nonpolar or semipolar surface of a III-nitride substrate to form a VCSEL structure, the VCSEL structure comprising:
an active region;
an aluminum containing etch stop layer placed between the active region and the substrate to define the VCSEL's cavity length;

a p-type GaN layer, wherein the active region is between the p-type GaN layer and the aluminum containing etch stop layer;

an n-type GaN layer that is part of the substrate or between the substrate and the aluminum containing etch stop layer;

etching a mesa through the active region but stopping above the etch stop layer, to form a top surface of the epitaxial layers;

coating the top surface of the wafer with dielectric material;

etching an aperture in the dielectric material;

patterning and depositing a transparent conductive layer on the dielectric material and in the aperture to contact the p-type GaN in the aperture;

patterning and depositing metal on the transparent conductive layer, wherein the metal does not extend into the aperture;

depositing and patterning a first dielectric Distributed Bragg Reflector (DBR) on the metal;

depositing pad metal on the first dielectric DBR, wherein:
  (i) the pad metal makes n-type contact in a field around the first dielectric DBR to protect the first dielectric DBR during a subsequent etch,
  (ii) the pad metal coats a top of the first dielectric DBR for bonding to a submount in a subsequent flip-chip bonding process, and
  (iii) the pad metal is continuous from the top of the first dielectric DBR to the transparent conductive layer to inject current from the submount to the transparent conductive layer;

flip-chip bonding the submount to the top of the first dielectric DBR using the pad metal;

patterning and depositing a metal n-contact on the n-type GaN layer;

selectively etching down to the aluminum containing etch stop layer; and depositing a second dielectric DBR on the aluminum containing stop etch layer and the metal n-type contact, wherein light from the VCSEL is emitted through the second dielectric DBR.

19. The method of claim 18, wherein the epitaxial layers comprise an Indium (In) containing sacrificial layer between the substrate and the aluminum containing etch stop layer, the method further comprising at least partially removing the substrate by laterally photoelectrochemically (PEC) etching the substrate down to the In containing sacrificial layer.

20. The method of claim 18, wherein the aluminum containing etch stop layer is positioned to define the cavity length such that the VCSEL has single mode operation or the cavity length is 3 micrometers or less.

* * * * *